(12) United States Patent
Tour et al.

(10) Patent No.: US 9,997,705 B2
(45) Date of Patent: Jun. 12, 2018

(54) POROUS SIO$_x$ MATERIALS FOR IMPROVEMENT IN SIO$_x$ SWITCHING DEVICE PERFORMANCES

(71) Applicant: WILLIAM MARSH RICE UNIVERSITY, Houston, TX (US)

(72) Inventors: James M. Tour, Bellaire, TX (US); Gunuk Wang, Houston, TX (US); Yang Yang, Beijing (CN); Yongsung Ji, Houston, TX (US)

(73) Assignee: William Marsh Rice University, Houston, TX (US)

(*) Notice: Subject to any disclaimer, the term of this patent is extended or adjusted under 35 U.S.C. 154(b) by 0 days. days.

(21) Appl. No.: 15/033,726

(22) PCT Filed: Nov. 19, 2014

(86) PCT No.: PCT/US2014/066303
§ 371 (c)(1),
(2) Date: May 2, 2016

(87) PCT Pub. No.: WO2015/077281
PCT Pub. Date: May 28, 2015

(65) Prior Publication Data
US 2016/0276588 A1    Sep. 22, 2016

Related U.S. Application Data

(60) Provisional application No. 61/906,011, filed on Nov. 19, 2013.

(51) Int. Cl.
*H01L 45/00* (2006.01)
*B82Y 10/00* (2011.01)
(Continued)

(52) U.S. Cl.
CPC .......... *H01L 45/1675* (2013.01); *B82Y 10/00* (2013.01); *B82Y 40/00* (2013.01);
(Continued)

(58) Field of Classification Search
CPC . H01L 21/06; H01L 27/2436; H01L 29/1606; H01L 29/413; H01L 45/04;
(Continued)

(56) References Cited

U.S. PATENT DOCUMENTS

| | | | | |
|---|---|---|---|---|
| 5,360,759 A | * | 11/1994 | Stengl | H01L 21/306 257/E21.215 |
| 2002/0096717 A1 | * | 7/2002 | Chu | H01L 27/1203 257/347 |

(Continued)

FOREIGN PATENT DOCUMENTS

WO    WO-2013134757 A1    9/2013

OTHER PUBLICATIONS

Strukov, D. B.; Snider, G. S.; Stewart, D. R.; Williams, R. S. The Missing Memristor Found. Nature 2008, 453, 80-83.
(Continued)

*Primary Examiner* — Daniel Luke
*Assistant Examiner* — Khatib Rahman
(74) *Attorney, Agent, or Firm* — Dickinson Wright PLLC; Ross Spencer Garsson; Mark E. Scott

(57) ABSTRACT

A porous memory device, such as a memory or a switch, may provide a top and bottom electrodes with a memory material layer (e.g. SiO$_x$) positioned between the electrodes. The memory material layer may provide a nanoporous structure. In some embodiments, the nanoporous structure may be formed electrochemically, such as from anodic etching. Electroformation of a filament through the memory material layer may occur internally through the layer rather than at an edge at extremely low electro-forming voltages.
(Continued)

The porous memory device may also provide multi-bit storage, high on-off ratios, long high-temperature lifetime, excellent cycling endurance, fast switching, and lower power consumption.

24 Claims, 15 Drawing Sheets

(51) Int. Cl.
    *B82Y 40/00*     (2011.01)
    *H01L 29/16*     (2006.01)
    *H01L 29/41*     (2006.01)
    *H01L 27/24*     (2006.01)
    *H01L 29/06*     (2006.01)

(52) U.S. Cl.
CPC ...... *H01L 27/2409* (2013.01); *H01L 27/2436* (2013.01); *H01L 29/1606* (2013.01); *H01L 29/413* (2013.01); *H01L 45/04* (2013.01); *H01L 45/1253* (2013.01); *H01L 45/145* (2013.01); *H01L 45/146* (2013.01); *H01L 45/1608* (2013.01); *H01L 45/1641* (2013.01); *H01L 29/0665* (2013.01); *H01L 29/0673* (2013.01)

(58) Field of Classification Search
CPC . H01L 45/1253; H01L 45/145; H01L 45/146; H01L 45/1608; H01L 45/1641; H01L 29/0673; B82Y 40/00
See application file for complete search history.

(56) References Cited

U.S. PATENT DOCUMENTS

| | | |
|---|---|---|
| 2005/0018477 A1 | 1/2005 | Baker |
| 2005/0019975 A1 | 1/2005 | Lee et al. |
| 2006/0249777 A1 | 11/2006 | Forbes et al. |
| 2008/0061341 A1* | 3/2008 | Lung .................. G11C 11/5678 257/303 |
| 2008/0157053 A1* | 7/2008 | Lai ...................... G11C 11/5678 257/4 |
| 2008/0212068 A1* | 9/2008 | Sailor ................ G01N 21/4738 356/36 |
| 2008/0296550 A1 | 12/2008 | Lee et al. |
| 2008/0304312 A1* | 12/2008 | Ho ........................ B82Y 10/00 365/148 |
| 2009/0261375 A1* | 10/2009 | Chen ...................... H01L 33/62 257/99 |
| 2010/0328996 A1* | 12/2010 | Shih ....................... H01L 45/06 365/163 |
| 2011/0035535 A1 | 2/2011 | Locasio et al. |
| 2011/0183525 A1* | 7/2011 | Purushothaman H01L 21/02203 438/778 |
| 2012/0020140 A1* | 1/2012 | Chen ....................... G11C 11/22 365/148 |
| 2012/0049149 A1 | 3/2012 | Lu et al. |
| 2012/0311228 A1* | 12/2012 | Hsu ..................... G06F 12/0246 711/102 |
| 2013/0043452 A1* | 2/2013 | Meyer .................. H01L 27/101 257/4 |
| 2013/0069030 A1 | 3/2013 | Wells et al. |
| 2013/0075683 A1* | 3/2013 | Fowler ................... H01L 45/00 257/2 |
| 2013/0075685 A1* | 3/2013 | Li ....................... G11C 13/0002 257/3 |
| 2013/0126818 A1 | 5/2013 | Chin et al. |
| 2014/0077150 A1* | 3/2014 | Ho ....................... H01L 27/2463 257/5 |
| 2014/0117303 A1* | 5/2014 | Wang .................... H01L 45/145 257/4 |
| 2016/0028004 A1 | 1/2016 | Tour et al. |

OTHER PUBLICATIONS

Burr et al., Overview of Candidate Device Technologies for Storage-Class Memory. IBM J. Res. Dev. 2008, 52, 449-464.

Doo Seok et al., Emerging Memories: Resistive Switching Mechanisms and Current status. Rep. Prog. Phys. 2012, 75, 076502.

Wentai et al., Improved Resistive Switching Uniformity in Cu/HfO2/Pt Devices by Using Current Sweeping Mode. IEEE Electron Device Lett 2011, 32 (8), 1053-1055.

Jun. Y. Resistive Switching and Memory Effects in Silicon Oxide Based Nanostructures. Doctorial Thesis, Rice University 2011.

Choi et al., Electrical Performance and Scalability of Pt Dispersed SiO2 Nanometallic Resistance Switch. Nano Lett. 2013, 13 (7), 3213-3217.

Yao et al., Resistive Switches and Memories from Silicon Oxide. Nano Lett. 2010, 10 (10), 4105-4110.

Yao, J.; Zhong, L.; Natelson, D.; Tour, J. M., In situ imaging of the conducting filament in a silicon oxide resistive switch. Sci. Rep. 2012, 2, 242.

Yao et al., Resistive Switching in Nanogap Systems on SiO2 Substrates. Small 2009, 5 (24), 2910-2915.

Yao, J.; Zhong, L.; Natelson, D.; Tour, J., Intrinsic resistive switching and memory effects in silicon oxide. Applied Physics A: Materials Science & Processing 2011, 102 (4), 835-839.

Wang et al., Resistive Switching Mechanism in Silicon Highly Rich SiO, (x < 0.75) Films Based on Silicon Dangling Bonds Percolation Model. Appl. Phy. Lett. 2013, 102, 042103-5.

Bersuker et al., Metal Oxide Resistive Memory Switching Mechanism Based on Conductive Filament Properties. J. Appl. Phys. 2011, 110, (12) 124518-12.

Goux et al., Optimized Ni Oxidation in 80-nm Contact Holes for Integration of Forming-Free and Low-Power Ni/NiO/Ni Memory Cells. IEEE Trans. Electron Devices, 2009, 56, 2363-2368.

Chang et al., Study of Polarity Effect in SiOx-Based Resistive Switching Memory. Appl. Phy. Lett. 2012, 101, 052111-4.

H. Shinoda, T. Nakajima, K. Ueno, N. Koshida, Thermally induced ultrasonic emission from porous silicon, Nature, 1999, 400, 853-855.

Bez, R. Camerlenghi, E. Modelli, A. Visconti, A. Introduction to Flash Memory. Proceedings of the IEEE 2003, 91, 489-502.

Lankhorst, M. H. R.; Ketelaars, B. W. S. M. M.; Wolters, R. A. M. Low-Cost and Nanoscale Non-Volatile Memory Concept for Future Silicon Chips. Nat. Mater. 2005, 4, (4), 347-352.

Thompson et al., In Search of "Forever," Continued Transistor Scaling One New Material at a Time. IEEE Trans. Semiconduct. M. 2005, 18, 26-36.

International Technology Roadmap for Semiconductors: ITRS 2012 Edition-Emerging Research Devices.

Kim, K. M.; Jeong, D. S.; Hwang, C. S. Nanofilamentary Resistive Switching in Binary Oxide System; a Review on the Present Status and Outlook. Nanotechnology 2011, 22, 254002.

Chen et al., Dynamic Evolution of Conducting Nanofilament in Resistive Switching Memories. Nano Lett. 2013, 13, 3671-3677.

Wang, G.; Raji, A.-R. O.; Lee, J.-H.; Tour, J. M. Conducting-Interlayer SiOx Memory Devices on Rigid and Flexible Substrates. ACS Nano 2014, 8, (2), 1410-1418.

Yoshida, C.; Kinoshita, K.; Yamasaki, T.; Sugiyama, Y. Direct Observation of Oxygen Movement During Resistance Switching in NiO/Pt Film. Appl. Phys. Lett. 2008, 93, 042106.

Ryan et al., Electronic Connection to the Interior of a Mesoporous Insulator with Nanowires of Crystalline RuO2. Nature 2000, 406, 169-172.

Lee et al., Efficient Hybrid Solar Cells Based on Meso-Superstructured Organometal Halide Perovskites. Science 2012, 338, 643-647.

Brezesinski, T.; Wang, J.; Tolbert, S. H.; Dunn, B. Ordered Mesoporous α-MoO3 with Iso-Oriented Nanocrystalline Walls for Thin-Film Pseudocapacitors. Nat. Mater. 2010, 9, 146-151.

Hong et al., Large Resistive Switching in Ferroelectric BiFeO3 Nano-Island Based Switchable Diodes. Adv. Mater. 2013, 25, 2339-2343.

Ho et al., All-Polymer Optoelectronic Devices. Science 1999, 285, 233-236.

(56) References Cited

OTHER PUBLICATIONS

Yao et al., Highly Transparent Nonvolatile Resistive Memory Devices from Silicon Oxide and Graphene. Nat. Commun. 2012, 3, 1101.
He et al., Multilevel Resistive Switching in Planar Graphene/SiO2 Nanogap Structures. ACS Nano 2012, 6, 4214-4221.
Guan et al., Nonpolar Nonvolatile Resistive Switching in Cu Doped ZrO2. IEEE Electron Device Lett. 2008, 29, 5, 434-437.
Cho et al., Unipolar Nonvolatile Memory Devices with Composites of Poly(9-vinylcarbazole) and Titanium Dioxide Nanoparticles. Org. Electron. 2009, 10, 473-477.
Ji et al., Unipolar Bistable Switching of Organic Non-Volatile Memory Devices with Poly(styrene-co-styrenesulfonic Acid Na). J. Nanosci. Nanotech. 2011, 11, 1385-1388.
Yan, X. B.; Yin, J.; Liu, Z. G.; Xia, X. Y. Studies on the Reset Power Needed for the Unipolar Resistive Switching in Amorphous SrTiO3-δ Films Induced by Electrical Pulse. Phys. Lett. A 2011, 375, 3599-3603.
Kim, H.-D.; An, H.-M.; Hong, S. M.; Kim, T. G. Unipolar Resistive Switching Phenomena in Fully Transparent SiN-Based Memory Cells. Semicond. Sci. Technol. 2012, 27, 125020.
Kim, Y.-M.; Lee, J.-S. Reproducible Resistance Switching Characteristics of Hafnium Oxide-Based Nonvolatile Memory Devices. J. Appl. Phys. 2008, 104, 114115.
Seo et al., Transparent Flexible Resistive Random Access Memory Fabricated at Room Temperature. Appl. Phys. Lett. 2009, 95, 133508-133503.
Song et al., Three-Dimensional Integration of Organic Resistive Memory Devices. Adv. Mater. 2010, 22, 5048-5052.
Bharti et al., CAFM Investigations of Filamentary Conduction in Cu2O ReRAM Devices Fabricated Using Stencil Lithography Technique. Nanotechnology 2012, 23, 495707.
Chen, A.; Lin, M.-R. In Variability of Resistive Switching Memories and its Impact on Crossbar Array Performance. IEEE International Reliability Physics Symposium (IRPS). 2011, MY.7.1-MY.7.4.
Kim, S.; Choi, Y.-K. Resistive Switching of Aluminum Oxide for Flexible Memory. Appl. Phys. Lett. 2008, 92, 223508-223503.
Miao Zhang et al, Oxidation of nanopores in a silicon membrane: self-limiting formation of sub-10 nm circular openings, Nanotechnology 2014, 25 355302.
Hwan Kim et al., Schottky diode with excellent performance for large integration density of crossbar resistive memory; Applied Physics Letters, 100, 213508 (2012).
Waser, R.; Aono, M. Nanoionics-Based Resistive Switching Memories. Nat. Mater. 2007, 6, 833-840.
Sawa, A. Resistive Switching in Transition Metal Oxides. Materials Today 2008, 11, 28-36.
Lee et al., Current Density and Nonlinearity Combination of Selection Device Based on Ta0x/Ti02/Ta0x Structure for One Selector-One Resistor Arrays. ACS Nano 2012, 6 (9), 8166-8172.
Kim et al., 32 × 32 Crossbar Array Resistive Memory Composed of a Stacked Schottky Diode and Unipolar Resistive Memory. Adv. Funct. Mater. 2013, 23 (11), 1440-1449.
Lee et al., A fast, high-endurance and scalable non-volatile memory device made from asymmetric Ta205-x/TaO2-x bilayer structures. Nat. Mater. 2011, 10 (8), 625-630.
Jo, S. H.; Lu, W. CMOS Compatible Nanoscale Nonvolatile Resistance Switching Memory. Nano Letters 2008, 8, 392-397.
Waser, R.; Dittmann, R.; Staikov, G.; Szot, K. Redox-Based Resistive Switching Memories-Nanoionic Mechanisms, Prospects, and Challenges. Adv. Mater. 2009, 21, 2632-2663.
Hamann, H. F.; O'Boyle, M.; Martin, Y. C.; Rooks, M.; Wickramasinghe, H. K. Ultra-High-Density Phase-Change Storage and Memory. Nat. Mater. 2006, 5, 383-387.
Yang, J. J.; Strukov, D. B.; Stewart, D. R. Memristive Devices for Computing. Nat. Nanotech. 2013, 8, 13-24.
Yang, Y.; Choi, S.; Lu, W. Oxide Heterostructure Resistive Memory. Nano Lett. 2013, 13, 2908-2915.
Wang et al., High-Performance and Low-Power Rewritable SiOx 1 kbit One Diode-One Resistor Crossbar Memory Array. Adv. Mater. 2013, 25, 4789-4793.
Lee et al., Low-Temperature-Grown Transition Metal Oxide Based Storage Materials and Oxide Transistors for High-Density Non-Volatile Memory. Adv. Funct. Mater. 2009, 19, 1587-1593.
Ji et al., Integrated One Diode-One Resistor Architecture in Nanopillar SiOx Resistive Switching Memory by Nanosphere Lithography, Nano Lett., 2014, 14 (2), pp. 813-818.
Wang et al., Nanoporous Silicon Oxide Memory, Nano Lett., 2014, 14 (8), pp. 4694-4699.
Li, Yubao et al.; "Electronic two-terminal bistable graphitic memories"; nature materials, pp. 966-971; vol. 7; Nov. 16, 2008, www.nature.com/naturematerials; Macmillan Publishers Limited.
Yao, Jun et al.;"Silicon Oxide: A Non-innocent Surface for Molecular Electronics and Nanoelectronics Studies"; Journal of the American Chemical Society (JACS); Dec. 22, 2010; pp. 941-948; American Chemical Society (ACS) Publications.

\* cited by examiner

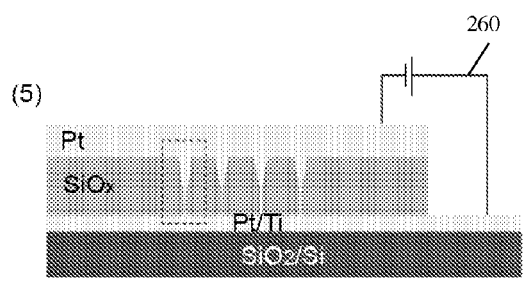
FIG. 2G
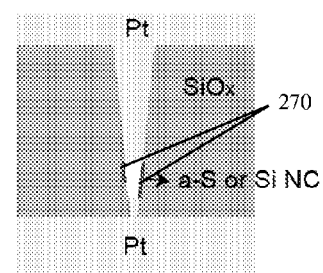
FIG. 2H
(1) Top view                (2) Side view
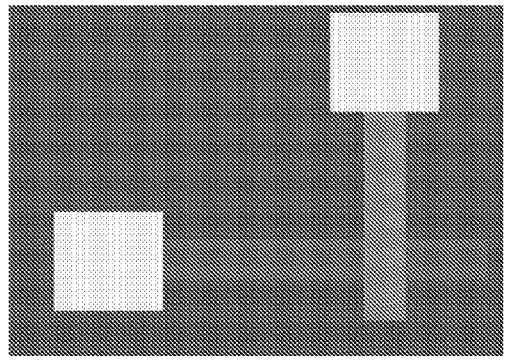
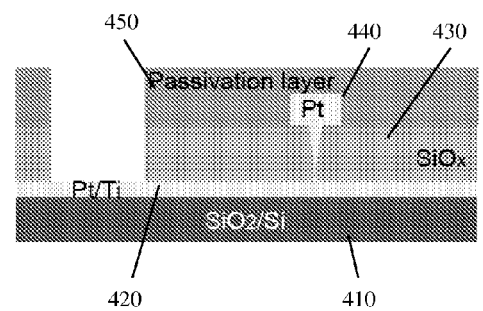
FIG. 3A-3B (1) Top view                    (2) Side view (1) Top view
(2) Side view
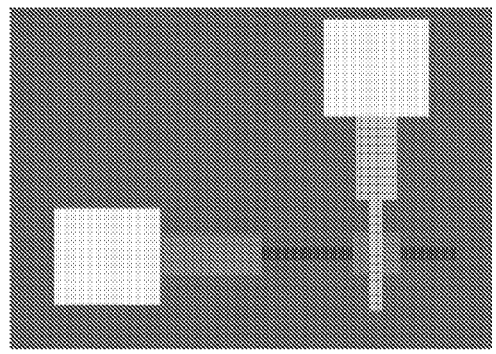
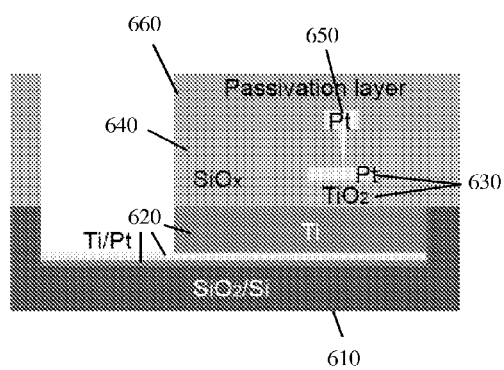
FIGS. 6A-6B
Side view
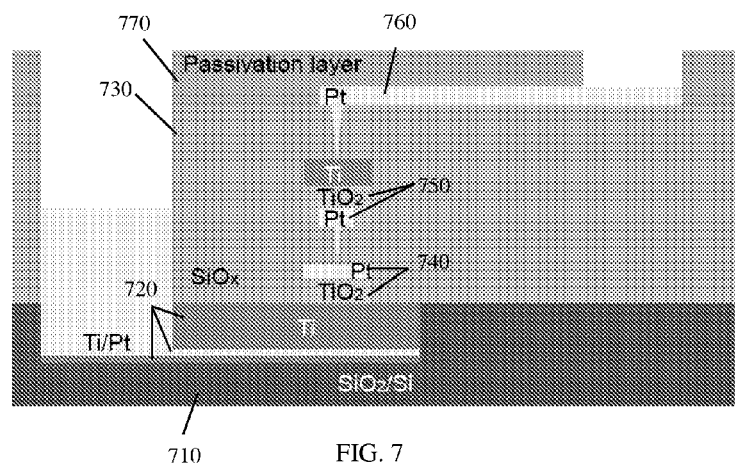
FIG. 7

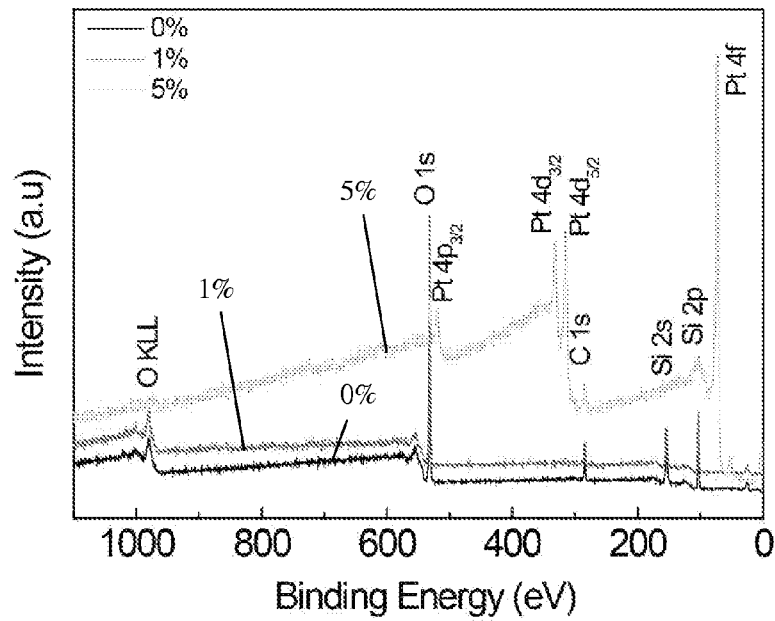
FIG. 12
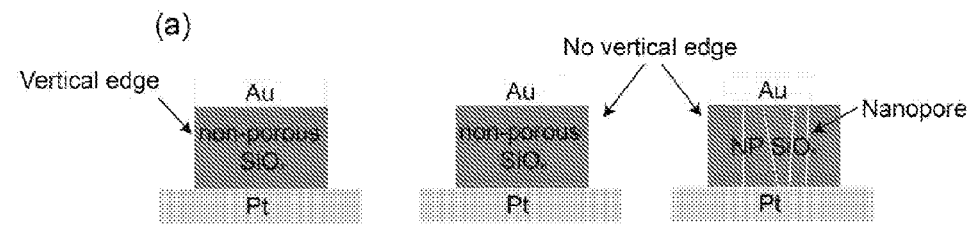
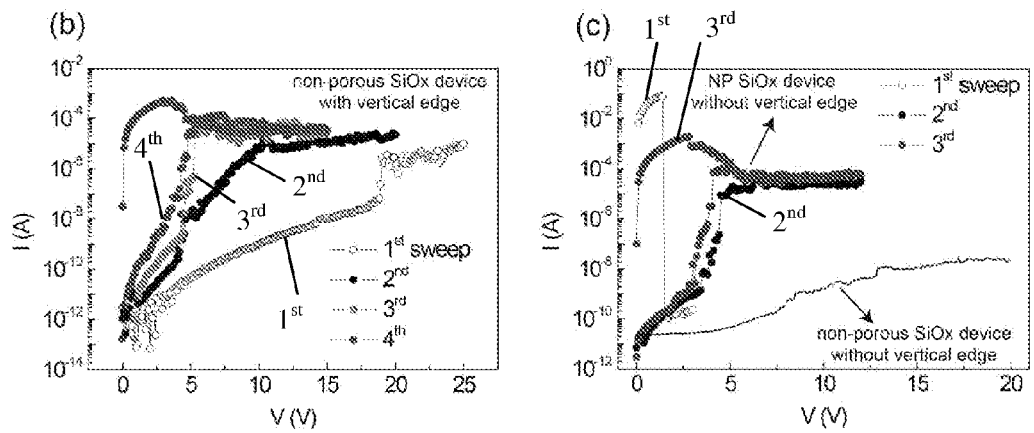
FIGS. 13A-13C

| Memory Devices | Endurance # | On-Off Ratio | $V_{forming}$ (V) | $I_{cc}$ (A) | On power (W/bit) | $I_c$ (A) [c] | High Temp.[T] | V-Edge [e] | Ref. # |
|---|---|---|---|---|---|---|---|---|---|
| Au/NP SiO$_x$/Pt | ≥ $10^3$ | ~$10^3$-$10^7$ | -1.6 ± 0.4 | ~1.4 ± 0.9 × $10^{-5}$ | ~6.2 ± 4.0 × $10^{-5}$ | × | × | × | Our result |
| Pt/NP SiO$_x$/Pt | - | ~4.0 × $10^4$ | 2.1 | ~1.5 × $10^{-5}$ | ~8.3 × $10^{-5}$ | × | × | × | Our result |
| Cu/Cu-ZrO$_2$/Pt | ~10 | ~$10^6$ | - | ~5.0 × $10^{-3}$ | ~2.0 × $10^{-2}$ | o | × | × | S5 |
| Al/PVK-TiO$_2$/ITO | ~35 | ~$10^5$ | ~8.0 | ~1.8 × $10^{-4}$ | ~7.2 × $10^{-3}$ | × | × | × | S6 |
| Au/PSSA:Na/ITO | ~50 | ~$10^5$ | ~8.0 | ~$10^{-4}$ | ~4.0 × $10^{-3}$ | × | × | × | S7 |
| Pt/SrTiO$_3$:v/Pt | ~80 | ~$10^4$ | ~14.0 | ~$10^{-2}$ | ~4.0 × $10^{-2}$ | o | o | × | S8 |
| Pt/SiO$_{0.5}$/Pt | ~$10^2$ | ~$10^5$ | ~10.5 | ~$10^{-2}$ | ~1.6 × $10^{-2}$ | o | o | × | S9 |
| ITO/SiN/ITO | ~$10^2$ | ~$10^5$ | ~4.2 | ~2.0 × $10^{-2}$ | ~4.0 × $10^{-2}$ | o | × | × | S10 |
| Graphene/SiO$_x$/ITO | ~$10^2$ | ~5.0 × $10^3$ | ~33.0 | ~3.5 × $10^{-5}$ | ~1.8 × $10^{-3}$ | × | × | o | S11 |
| Pt/HfO$_2$/Pt | ~1.6 × $10^2$ | ~$10^5$ | ~4.8 | ~5.0 × $10^{-3}$ | ~1.3 × $10^{-2}$ | o | o | × | S12 |
| ITO/ZnO/ITO | ~2.0 × $10^2$ | ~10 | ~3.2 | ~$10^{-2}$ | ~1.5 × $10^{-2}$ | o | × | × | S13 |
| Pt/TiO$_2$/Pt | ~2.5 × $10^2$ | ~$10^5$ | ~2.3 | ~$10^{-2}$ | ~3.0 × $10^{-2}$ | o | o | × | S14 |
| Au/Pt:PCBM/Al | ~2.8 × $10^2$ | ~$10^5$ | ~8.0 | ~2.0 × $10^{-2}$ | ~8.0 × $10^{-2}$ | × | × | × | S15 |
| Graphene/SiO$_x$/Graphene | ~3.0 × $10^2$ | ~$10^5$ | -- | ~$10^{-4}$ | ~4.0 × $10^{-3}$ | × | × | o | S11 |
| TiN/SiO$_2$/TiN | ~3.0 × $10^2$ | ~$10^4$ | ~14.0 | ~2.0 × $10^{-4}$ | ~8.0 × $10^{-3}$ | × | o | o | S16 |
| Pd-Pt-SiO$_x$/Pt | ~6.0 × $10^2$ | ~$10^4$ | ~8.3 | ~$10^{-4}$ | ~5.0 × $10^{-3}$ | × | × | o | S17 |
| Ti/Cu$_2$O/Cu | ~6.0 × $10^2$ | ~10 | ~19.76 | ~8.0 × $10^{-5}$ | ~3.2 × $10^{-3}$ | o | o | × | S18,S19 |
| Pd/SiO$_x$/Pt | ~6.0 × $10^2$ | ~$10^5$ | ~21.1 | ~3.0 × $10^{-5}$ | ~1.5 × $10^{-3}$ | × | × | o | S17 |
| Al/Al$_2$O$_3$/Al | ~5.0 × $10^3$ | ~$10^5$ | ~3.5 | ~1.0 × $10^{-3}$ | ~2.5 × $10^{-3}$ | o | × | × | S20 |
| Pt/NiO/Pt | ~$10^4$ | ~$10^2$ | ~1.8 | ~$10^{-2}$ | ~1.8 × $10^{-2}$ | o | o | × | S21,S22 |

FIG. 19

POROUS SIO$_x$ MATERIALS FOR IMPROVEMENT IN SIO$_x$ SWITCHING DEVICE PERFORMANCES

RELATED APPLICATIONS

This application claims the benefit of U.S. Provisional Patent Application No. 61/906,011, filed on Nov. 19, 2013, which is incorporated herein by reference.

STATEMENT REGARDING FEDERALLY SPONSORED RESEARCH

This invention was made with government support under Grant No. N00014-09-1-1066 awarded by the U.S. Department of Defense; Grant No. FA9550-12-1-0035 awarded by the U.S. Department of Defense; and Grant No. FA9550-09-1-0581 awarded by the U.S. Department of Defense. The government has certain rights in the invention.

FIELD OF THE INVENTION

This invention relates to porous memory materials, such as silicon oxide. More particularly, to utilizing porous silicon oxide materials in switching or memory devices.

BACKGROUND OF INVENTION

For more than a half century, conventional Si-based complementary metal-oxide-semiconductor (CMOS) transistors have been the mainstay of the electronic memory industry. Furthermore, Si-based flash memory's superior performance and its ease of fabrication compared to competing memory technologies has made it the dominant form of CMOS memory. However, the high standards of next-generation memory driven by rapidly growing demands have revealed the limits of current Si-based flash memory technology in terms of its fundamental scaling limitations, energy consumption, cost, and few microsecond switching speed. Although a wide variety of oxide-based materials and device structures for the replacement of the Si-based flash memories have been extensively investigated, none have adequately addressed future memory projections. Generally, the oxide-based resistive random access memories (RRAMs) can be categorized into unipolar, which can be programmed by the same voltage polarity, and bipolar memories, which can be programmed by reversing the voltage polarity. Many of the unipolar memories have demonstrated operation by nano-scale filamentary switching that allow them to follow an aggressive scaling trend; however, nano-scale metallic filaments can exhibit unstable switching behaviors, and high or unpredictable forming voltages ($V_{forming}$) due to the difficulty in controlling their stochastic formation. In contrast, bipolar memory has comparative advantages in the switching stability by an ionic movement or a redox process, with lower $V_{forming}$, and a broader range of materials availability. However, these come at the expense of lower switching ON-OFF ratios, limited thermal stability of the materials, or the limits of integration architectures to suppress sneak-currents in high-density crossbar arrays. Both unipolar and bipolar memory fabrications often involve high-temperature processes for materials depositions. Moreover, the devices commonly have a high switching current and need a compliance current ($I_c$) for preventing an electrical short, which requires an additional resistor on each cell and increases power consumption. To improve future nonvolatile memory, it is desirable to resolve the aforementioned challenges of each oxide-based memory system, such as by eliminating the need for $I_c$ or high temperature fabrication processes.

Nanoporous (NP) metal oxides have been widely used in electronics for energy production and storage. While NP materials have been used as templates for oxide memory applications, they have not yet been used as the active switching medium for resistive nonvolatile memory application.

The following disclosure discusses porous silicon oxide materials utilized as a unipolar switching medium and methods for fabricating porous silicon oxide materials. This new implementation of a porous oxide material in electronic devices meets the metrics desired for next-generation industrial performance. These new implementations also outperform present unipolar memory systems and can also bring advantages to bipolar memories. These can be used as memristors as well. Using this porous material structure, the stochastic formation of the switching filament may be controlled, which leads to significant improvements in device metrics, and the device can be fabricated at room temperature.

SUMMARY OF INVENTION

In one embodiment, a method for forming or fabricating a memory device may include the steps of depositing a bottom electrode on a substrate and depositing a material layer on the bottom electrode. The method may further include etching the material layer to form a porous structure and depositing a top electrode. In some embodiments, the porous structure is formed by anodic etching. In some embodiments, the etching may be performed in a HF/ethanol solution. In some embodiments, the method may further include applying a voltage sweep to the porous material layer to form a filament through the layer. In some embodiments, the filament may form internally through the porous material layer.

In one embodiment, a porous device, such as a memory or a switch, may provide a top and bottom electrodes with a material layer (e.g. SiO$_x$) positioned between the electrodes. The material layer may provide a nanoporous structure. In some embodiments, the nanoporous structure may be formed electrochemically, such as from anodic etching. Electroformation of a filament through the material layer may occur internally through the layer rather than at an edge at extremely low electroforming voltages. The porous memory device may also provide multi-bit storage, high on-off ratios, long high-temperature lifetime, excellent cycling endurance, fast switching, and lower power consumption.

The foregoing has outlined rather broadly various features of the present disclosure in order that the detailed description that follows may be better understood. Additional features and advantages of the disclosure will be described hereinafter.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein:

FIGS. 2A-2H show an illustrative embodiment of a fabrication sequence for a NP $SiO_x$ memory;

FIGS. 3A-3B show a top and side view of an illustrative embodiment of a crossbar structure for encapsulated NP $SiO_x$ memory;

FIGS. 6A-6B shows a top and side view of an illustrative embodiment of a 1D-1R junction structure, which can be extended to a 3D stackable memory;

FIG. 7 is a side view of an illustrative embodiment of a stacking 1D-1R junction structure;

FIG. 12 shows investigations on the surface chemical compositions of the $SiO_x$ film with different concentration of dilute HF/ethanol solution (0, 1, and 5 vol %);

FIGS. 13A-13C show (a) schematic diagrams for the non-porous and NP $SiO_x$ memory junctions, (b) electroforming process and switching I-V curves of a non-porous $SiO_x$ memory device with a vertical junction edge, and (c) electroforming process and switching I-V curve of the non-porous and NP $SiO_x$ memory devices without a vertical junction edge;

FIG. 19 shows a table summary (Table 2) of switching parameters of NP $SiO_x$ (top two entries) unipolar memory and non-porous (remaining entries) memory, including endurance cycles, ON-OFF ratio, $V_{forming}$, $I_{set}$, ON power values, indications of whether compliance current, high temperature processes, and vertical junction edge for switching are needed, respectively (The symbol "x" means "not required" and "o" means required).

DETAILED DESCRIPTION

Figures 1A, 1B, 1C, 1D, 1E, 1F, 1G:
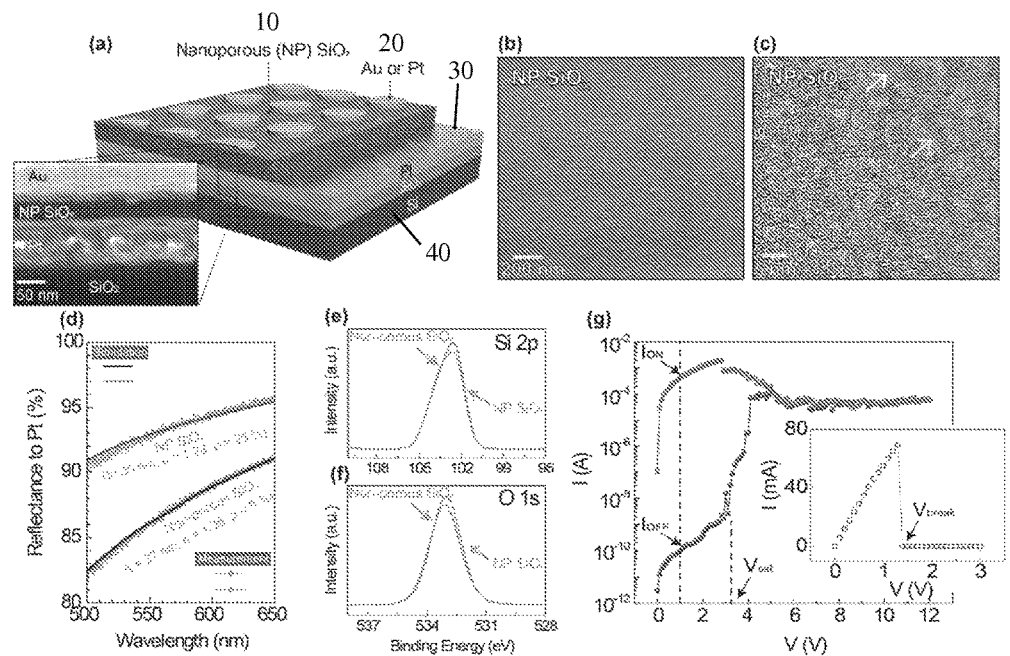
FIGS. 1A-1G are (a) a nonlimiting schematic illustration of a NP SiO$_x$ memory device with a cross-sectional SEM image of a selected cell, (b) SEM image of the NP SiO$_x$ film tilted at 45°, (c) TEM image of the NP $SiO_x$ film, (d) the reflectance spectra of non-porous and nanoporous (NP) $SiO_x$ layers on a Pt-deposited silicon substrate with the numerical fitting curves based on an analytical formula using the measured thickness, (e) and (f) XPS Si2p and O1s spectra of the non-porous and NP $SiO_x$ films (x=1.63 to 1.76), respectively, and (g) the representative I-V characteristics of the NP $SiO_x$ with the initial I-V sweep (Inset)

Refer now to the drawings wherein depicted elements are not necessarily shown to scale and wherein like or similar elements are designated by the same reference numeral through the several views.

Referring to the drawings in general, it will be understood that the illustrations are for the purpose of describing particular implementations of the disclosure and are not intended to be limiting thereto. While most of the terms used herein will be recognizable to those of ordinary skill in the art, it should be understood that when not explicitly defined, terms should be interpreted as adopting a meaning presently accepted by those of ordinary skill in the art.

It is to be understood that both the foregoing general description and the following detailed description are exemplary and explanatory only, and are not restrictive of the invention, as claimed. In this application, the use of the singular includes the plural, the word "a" or "an" means "at least one", and the use of "or" means "and/or", unless specifically stated otherwise. Furthermore, the use of the term "including", as well as other forms, such as "includes" and "included", is not limiting. Also, terms such as "element" or "component" encompass both elements or components comprising one unit and elements or components that comprise more than one unit unless specifically stated otherwise.

Oxide-based two-terminal resistive random access memory (RRAM) is considered to be one of the most promising candidates for next-generation nonvolatile memory. Systems and methods forming porous memory material layers in devices, such as memories and switches, are discussed herein. For the purposes of illustration, the following discussion may refer specifically to $SiO_x$ memories or layers. However, it will be recognized by one of ordinary skill in the art that concepts applied to the $SiO_x$ memories or layers may also be applied other materials. Nonlimiting examples of suitable memory materials may include $SiO_x$ (where $0.2 \leq x \leq 2$).

$SiO_x$ memory may provide several benefits over other unipolar memory, such as beneficial switching currents, on-off ratios, aggressive scaling down the nanoscale, low operating voltages, and operation in atmospheric environments by controlling oxygen content "x" under 0.75 and its bonding configurations. However, despite great switching properties in $SiO_x$ unipolar memory, the switching properties have two limitations: (a) few endurance cycles (~1000 cycles); and (b) high electroforming voltage (>20 V). The above deficiencies can be obviated by using a porous $SiO_x$. New RRAM memory structures employing a nanoporous (NP) silicon oxide ($SiO_x$) material are discussed herein, which enables unipolar switching through an internal vertical-nanogap in the NP silicon oxide rather than an edge. Through the control of the stochastic filament formation at low voltage, the NP $SiO_x$ memory exhibited extremely low electroforming voltage (e.g. ~<5 V) and outstanding performance metrics. These include multi-bit storage ability (e.g. up to 9-bits), high ON-OFF ratio (e.g. up to ~$10^7$ A), long high-temperature lifetime (e.g. ≥$10^4$ s at 100° C.), excellent cycling endurance (e.g. ≥$10^5$), fast switching speeds (e.g. sub 50 ns), and low power consumption (e.g. ≤$6\times10^{-5}$ W/bit). The NP silicon oxide material also provides room temperature processability for versatile fabrication without any compliance current ($I_c$) being needed during electroforming or switching operations. Taken together, these metrics in NP $SiO_x$ RRAM provide a route toward easily accessed nonvolatile memory applications.

FIG. 1A is an illustrative embodiment of a schematic diagram of the NP memory cells along with a cross-sectional scanning electron microscope (SEM) image at the middle of the cell (inset). The NP memory material layer 10 is provided between electrode layers 20 and 30. The NP memory material layer 10 and electrode layers 20 and 30 may be deposited on top of a substrate 40. In some embodiments, the NP memory material layer 10 may be $SiO_x$ where 0.2>x>2. The electrode layer 20 and 30 may be made of any suitable electrode material. Nonlimiting examples may include Au, Pt, Cu, Al, ITO, graphene, TiN, highly doped Si, or any other suitable metal, alloy or semiconductor material. In some embodiments, the substrate 40 may be formed of one or more materials, such as, but not limited to, Si, $SiO_x$, or the like. As a nonlimiting example, the NP memory cell shown in FIG. 1A may provide a $SiO_x$ NP memory material layer 10, Au or Pt top electrode 20, Pt bottom electrode 30, and Si/$SiO_x$ substrate 40.

In some embodiments, any currently known device arrangement may be modified into device arrangement that provides a porous memory material layer. In some embodiments, any currently known arrangement for silicon oxide-based memory cells may be modified to porous silicon oxide-based memory cells. In some embodiments, a porous unipolar $SiO_x$ memory cell adopts a layered structure with the $SiO_x$ (0.2≤x≤2) layer sandwiched between the top electrode (TE) and bottom electrode (BE). In some embodiments, after the memory unit is electroformed into a switchable state, a moderate voltage pulse (e.g, equal to or between 3 to 6 V) can set/write the unit into a low-resistance (on) state while a higher voltage pulse (e.g., ≥7 V) can reset/erase the unit to a high-resistance (off) state. These resistance states can serve as the binary code 0 and 1 in digital information. Once programmed, the resistance states (both on and off states) are nonvolatile. In some embodiments, the memory readout shares the same electrode as the programming electrode. In some embodiments, only the memory readout is read at a lower voltage (e.g. ≤3 V). In some embodiments, the memory state can be read nondestructively. Due to the similarity to pure $SiO_x$ memory operation, it shall be understood that the memory programming and readout NP $SiO_x$ memory discussed herein may operate in the same or similar manner as non-porous $SiO_x$ memory.

Figures 8A, 8B, 8C, 8D:
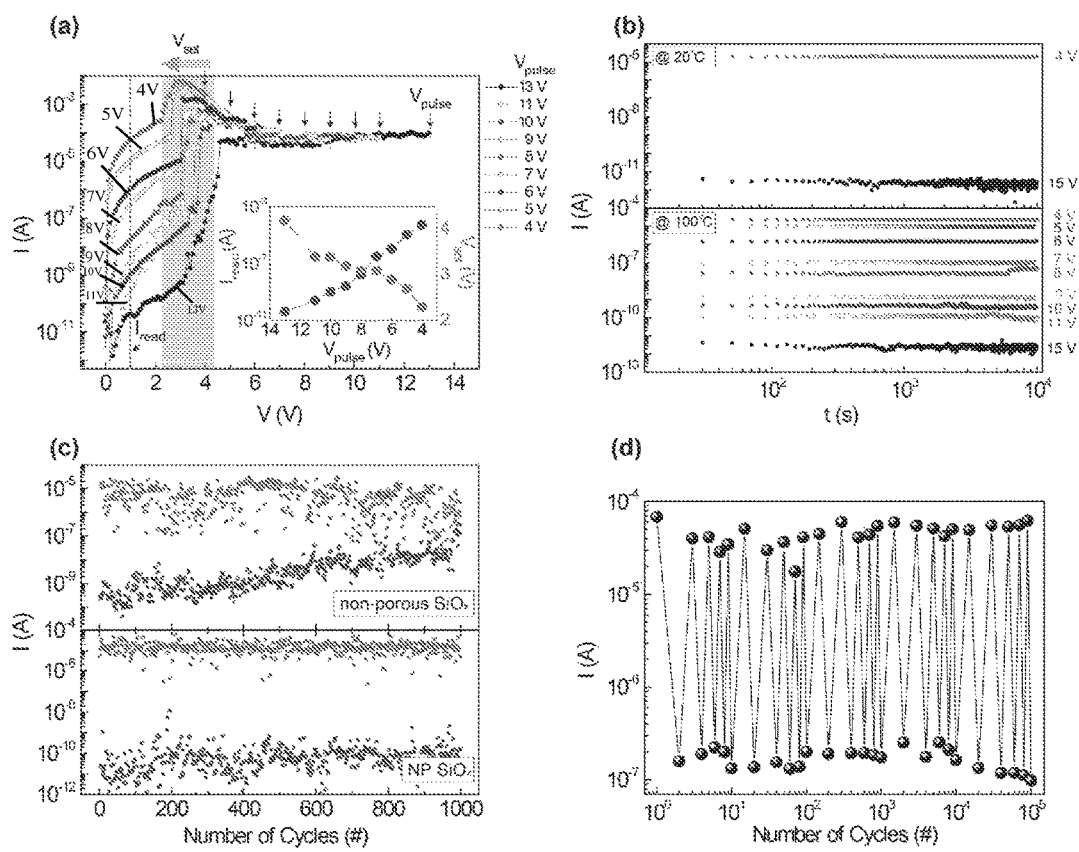
FIGS. 8A-8D are (a) a set of I-V characteristics of a single NP $SiO_x$ cell after exposure to different $V_{pulse}$ (changed from 13 to 4 V with $\Delta V=1$ V), (b) retention tests on a NP $SiO_x$ cell after different $V_{pulse}$ processes during $10^4$ s at 20° C. (top) and 100° C. (bottom), (c) endurance cycling test of an illustrative non-porous and NP $SiO_x$ cell for $10^3$ cycles; and (d) endurance cycling test of the NP $SiO_x$ cell for $10^5$ cycles (set voltage=5 V, reset voltage=15 V, and read voltage=1 V, ~500 μs for set, reset, and read voltage pulses)

Nonlimiting examples of advantages of NP $SiO_x$ memory in comparison to non-porous or traditional $SiO_x$ memory may include the following:

(1) In some embodiments, the switching cycles of porous $SiO_x$ memory systems can be endured for equal to or greater than $2\times10^3$ cycles. In some embodiments, the switching cycles of NP $SiO_x$ may be endured for over $10^4$ cycles. In some embodiments, the switching cycles of NP $SiO_x$ may be endured for over 100,000 cycles, which is 10 to 100 times more cycles than traditional non-porous $SiO_x$ memories (FIGS. 8C-8D). In some embodiments, the switching cycle endurance may be achieved with $10^3$ on-off ratio.

(2) Porous $SiO_x$ memory systems do not need an edge of the $SiO_x$ layer for switching, or in other words, they have a filament or switching path inside of $SiO_x$ layer. This advantage permits fabrication of a stacking memory integration structure with an isolation layer. Nonporous $SiO_x$ memory requires an edge between electrodes and $SiO_x$ layer, which limits the potential stacking memory application. The edge may be added through a series of etching (wet or dry) steps, whereas in the porous system, a simple crossbar address line can be applied to the porous platform without fabricating the edge. This is an enormous advantage for the porous memory systems, as the extra fabrication steps necessary to form this edge are no longer necessary to provide a working device.

(3) In regard to the electroforming voltage, the porous $SiO_x$ memory systems have low voltages required (FIGS. 13B-13C) to generate a filament or switching path as compared to 15 to 20 V in case of nonporous $SiO_x$. In some embodiments, the electroforming voltage is equal to or less than 10 V. In some embodiments, the electroforming voltage is equal to or less than 5 V. In some embodiments, the electroforming voltage is equal to or less than 2.1 V. In some embodiments, the electroforming voltage is equal to or less than 1.6 V. Hence, the problematic Joule-heating-damage to the surrounding oxide-based memory material itself is mitigated. If not mitigated, the Joule-heating-damage would limit the switching performance and the device yields required for future commercial memory applications.

Various methods may be utilized to make porous $SiO_x$ memory systems. In some embodiments, fabrication procedures for porous $SiO_x$ layers may involve one or more of the following steps: (1) A substrate may optionally be prepared for the memory system. As a nonlimiting example, the porous $SiO_x$ cells may fabricated on p-type (100) Si wafers (1.5 cm×1.5 cm) covered with thermally grown 300 nm-thick $SiO_2$. (2) A bottom electrode is deposited on the substrate, such as layer of Au, Pt, Cu, Al, ITO, graphene, TiN, highly doped Si, or any other suitable metal, alloy or semiconductor material. As a nonlimiting example, a Pt bottom electrode may be formed on the substrate by sputtering or E-beam evaporation after a typical cleaning process with acetone, isopropyl alcohol, and deionized (DI) water by ultrasonication (bath) for 3 min. (3) Next, the $SiO_x$ layer may be deposited on the bottom electrode. As a nonlimiting example, a $SiO_x$ (30-50 nm thick) may be deposited by using PECVD, E-beam evaporation, ALD, or any other suitable method for depositing $SiO_x$. (4) The porous structure may be prepared by an etching process. In some embodiments, a porous structure in the deposited $SiO_x$ layer may be formed electrochemically by anodic etching. In some embodiments, a porous structure in the deposited $SiO_x$ layer may be formed by E-beam lithography, reactive ion etching (RIE) with nanoparticles, or any other suitable methods for forming a porous structure. As a nonlimiting example, the SiO$_x$ layer may be etched in a dilute HF/ethanol solution under a constant current. (5) In some embodiments, the etching solution may be dilute HF/ethanol with the concentration of HF relative to ethanol equal to or between 0.01-10% by volume. In a nonlimiting example, dilute HF/ethanol solutions with concentration of 1, 5, 10 vol % were prepared by diluting HF (48-51 vol %, J. T. Baker) in absolute ethanol (Pharmo). A two-electrode system was used in anodic treatments with SiO$_x$ on silicon as the anode and platinum foil as cathode. A constant current density of 6.4 mA/cm$^2$ was applied for 30 s to fabricate the porous structure in the SiO$_x$ thin layer. (6) After electrochemical etching, the substrate and porous SiO$_x$ layer may be cleaned, rinsed, and dried. For example, after anodic etching, samples were rinsed with DI water and dried under a nitrogen flow. (7) Subsequently, the top electrode may be deposited on the porous SiO$_x$ layer. As a nonlimiting example, the top electrode may be deposited on the patterned area using photo-mask or shadow metal mask methods. (8) If necessary, non-active portions of the SiO$_x$ layer may be removed. In a nonlimiting example, reactive-ion etching (RIE) was performed to remove the non-active SiO$_x$ layer and exposed bottom Pt electrode. Notably, in some embodiments, the various steps of the fabrication process for the porous silicon oxide do not require any high temperature processing, and more particularly, each of the fabrication steps can be performed at room temperature. If desired, in some embodiments, the entire memory chip can be hermetically sealed to limit exposure to oxygen. This could involve the use of epoxy, silicon nitride, parylene, or the like.

The porous SiO$_x$ memory systems can have numerous variations, including the following:

1. The thickness of the layers (e.g., SiO$_x$ and electrodes) in the structures and the deposition can be varied to obtain optimum performance.

2. The concentrations of electrochemical etching solution can be varied to tailor the pore size and porosity of the SiO$_x$ layer as desired.

3. The applied current density during electrochemical etching can be varied to tailor the pore size and porosity of the SiO$_x$ layer as desired. In some embodiments, the NP layer may have pore size equal to or between 0.1 to 100 nm. In some embodiments, the NP layer may have pore size equal to or between 0.1 to 10 nm. In some embodiments, the NP layer may have pore size equal to or between 2-6 nm. In some embodiments the NP layer may have a pore size equal to 1 nm.

4. The electrochemical etching duration can be varied to tailor the pore size and porosity of the SiO$_x$ layer as desired.

5. Chemical and physical treatments on surfaces can be varied to obtain optimum performances for making porous SiO$_x$.

6. The x value in SiO$_x$ can be varied wherein $0.2 \leq x \leq 2$ to obtain the optimum performance from the memories.

7. The feature size and form of the cells can be varied to obtain optimum performance from the memories. For example, in some embodiments, the line width can be made far smaller. The pores in some of the illustrative embodiments are ~6 nm in diameter, but in other embodiments, the pores can be made smaller, such as 1 nm using varied anodization parameters, thereby accommodating narrower address lines.

8. Multi-bit or multi-level storage capability could be obtained in a porous SiO$_x$ memory unit wherein there is more than just a 0 and 1 state stored by a single cell, such as up to 9-bits. In some embodiments, one cell of the porous SiO$_x$ memory may provide multi-bit storage of 4-bits or more. In some embodiments, one cell of the porous SiO$_x$ memory may provide multi-bit storage of 5-bits or more. In some embodiments, one cell of the porous SiO$_x$ memory may provide multi-bit storage of 6-bits or more.

9. A multi-stacking structure (e.g., 3D from stacked 2D) can be utilized in a porous SiO$_x$ memory for ultra-dense memory arrays.

10. Various dilute HF/ethanol solutions can be used to generate SiO$_x$ memory systems.

11. Fabrication of advanced integration, such as 1D-1R, 1S-1R, 1T-1R, or the like, based on porous SiO$_x$ memories and in crossbar architectures are possible.

12. Diverse electrical and optical tests can be performed by the SiO$_x$ memory systems.

13. The porous SiO$_x$ memory systems of the present disclosure can be transparent in some embodiments.

14. The porous SiO$_x$ memory systems of the present disclosure can be flexible in some embodiments.

15. The porous SiO$_x$ memory systems of the present disclosure can be flexible and transparent in some embodiments.

Figures 2A, 2B:
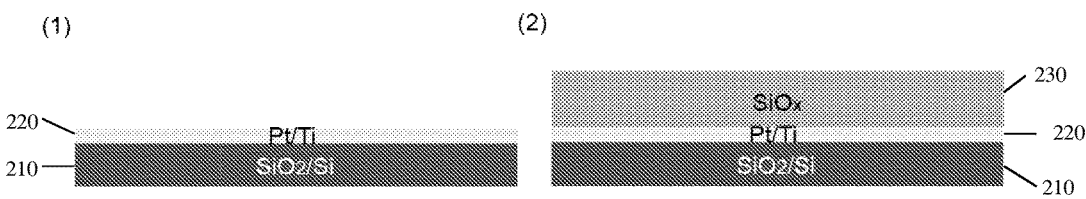

The following provides an illustrative embodiment of a fabrication process for a nanoporous silicon oxide memory as shown in FIGS. 2A-2H. (1) Bottom electrode 220 formation on the substrate 210 may occur as shown in FIG. 2A. For example, a Pt/Ti bottom electrode 220 is deposited on SiO$_x$/Si substrate 210. Ti is used as an adhesion layer 3-5 nm. In some embodiments, the electrode may be formed of Au, Pt, Cu, Al, ITO, graphene, TiN, highly doped Si, or any other suitable metal, alloy or semiconductor material. The thickness of the bottom electrode does not affect the switching performances of memory. Further, flexible substrates (e.g., PET and PEN) are available, but the flexible substrate could restrict the integration architectures that require higher temperature processes.

(2) A material layer 230 may be deposited as shown in FIG. 2B. For example SiO$_x$ 230 is deposited on the Pt/Ti electrode 220 that was deposited on the SiO$_x$/Si substrate 210. A 40 nm SiO$_x$ layer 230 may be deposited by PECVD or 100 nm SiO$_x$ by e-beam evaporation. An atomic ratio "x" between silicon and oxygen can have range from equal to or between 0.2 to 2. Any deposition system such as an e-beam evaporator, sputtering, PECVD, and ALD are suitable. The deposition method used could change the atomic ratio between silicon and oxygen, which results in needed variations of the anodization condition for forming the porous SiO$_x$. Further, the thickness of the SiO$_x$ can affect the conditions needed for the anodization process that determines the density of the pores and their sizes.

Figure 2C:
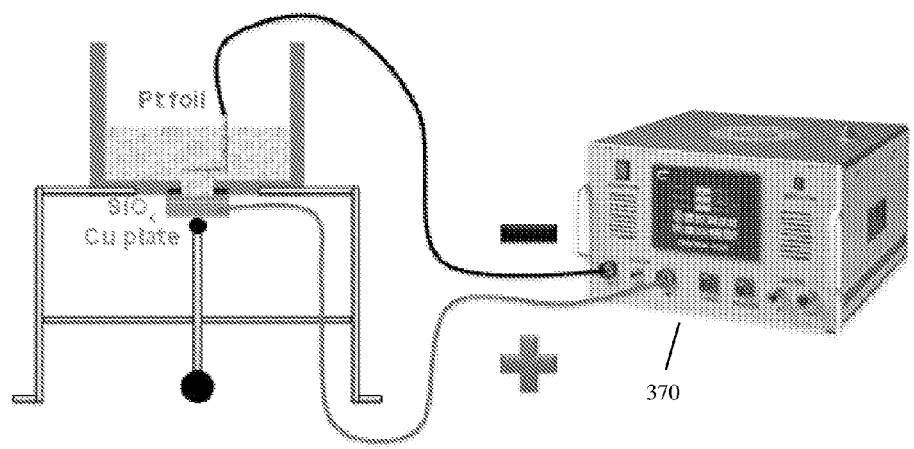
Figure 2D:
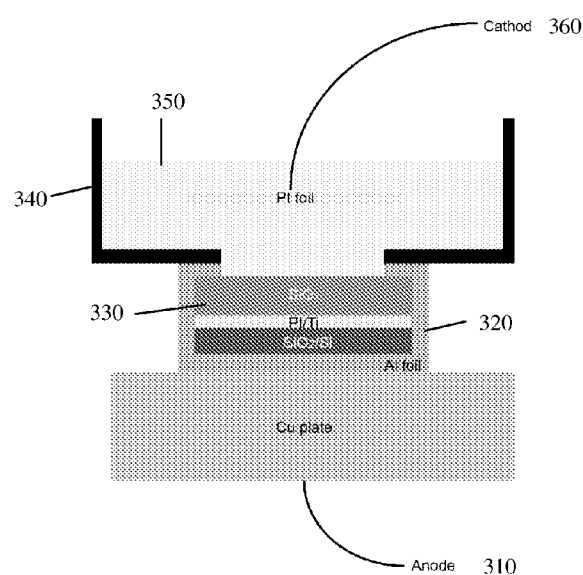

(3) Formation of nanoporous layer may occur as shown in FIGS. 2C-2D. FIG. 2C shows the experimental scheme for anodization process. FIG. 2D shows an enlarged view for the anodization process. In an illustrative embodiment, the anodization electrolyte 350 was prepared by mixing 1 vol % HF in ethanol (200 proof, 100%) placed in a container 340 (this was used on SiO$_x$ that had been prepared by PECVD at 300° C. for 1 min). A two-electrode system was used in anodic treatments with SiO$_x$ on silicon substrates 330 as the anode 310 and Pt foil as cathode 360. In some embodiments, the SiO$_x$ on silicon substrate 330 may be wrapped in Al foil 320 and placed in contact with a CU plate as the anode. A constant current density may be provided to the anode 310 and cathode 360 from a voltage or current source 370. For example, a constant current density of 6.4 mA cm$^{-2}$ was applied for 30 s to fabricate the nanoporous SiO$_x$. After anodic etching, samples were rinsed with DI water and dried under a nitrogen flow. The pore sizes range from equal to or between 2 to 6 nm. In case of $SiO_x$ deposited by e-beam evaporation, 0.2 vol % HF was used and an applied current for 10 s. In some embodiments, annealing may be performed for a predetermined amount of time before forming the porous layer. For example, annealing (350° C. for 1 h) before the anodization process can help to increase the yield of memory devices.

Figure 2E:
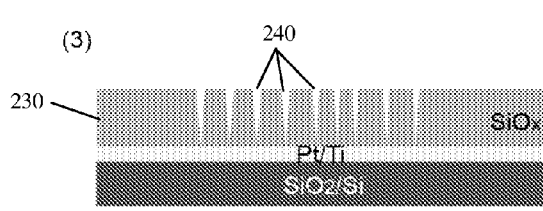

Any method for making nanopores in $SiO_x$ that have diameters of a few nm is suitable for the nanoporous memory discussed. For example, standard e-beam lithography and the proper oxidation process can form well-defined single nanopore structures inside the silicon oxide structure (Ref. *Nanotechnology* 2014, 25, (35), 355302.). Further, Si can change to porous $SiO_x$ by anodization treatment. Thus, in some embodiments, Si can be utilized in the deposition step instead of silicon oxide. The anodization treatment can control the density of porosity and the size of pores by modifying the potential and the current. FIG. 2E shows a resulting porous $SiO_x$ layer 230 with pores 240.

Figure 2F:
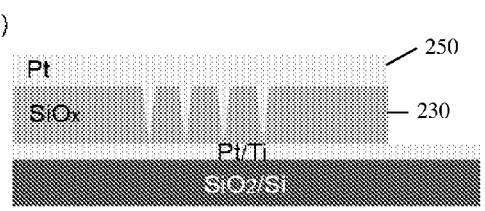

(4) The top electrode 250 on the nanoporous $SiO_x$ layer 230 and the two-terminal junction structure may be formed as shown in FIG. 2F. For example, using a circular photomask or a circular shadow metal mask method, a top electrode 250 (Au or Pt) was deposited on the nanoporous $SiO_x$ layer. An etching process may also be performed for removing uncovered nanoporous $SiO_x$ layer by RIE.

(5) The electroforming process or electro-breaking process for formation of the Si-switching channel 270 at the wall of the $SiO_x$ nanopore may be performed as shown in FIGS. 2G-2H. After the breaking process of metal by the electromigration process from the initial voltage sweep applied by a voltage or current source 260, the Si-switching channel 270 is formed. Other pore regions may be broken as well, but do not contribute the switching. It is theorized that only one pore having the smallest radius, thereby having the highest potential, provides the switching channel. In the case of the large pores, it is much easier to get larger gap distance between Pt electrodes by the electromigration process, which leads to the reduction of potential for the formation of the final Si switching channel. The gap distance by the electromigration process is dependent on the pore size, the applied voltage, and the temperature.

Encapsulated crossbar nanoporous silicon oxide memory: A crossbar structure for encapsulated nanoporous $SiO_x$ memory is shown in FIGS. 3A-3B. Substrate 410 may provide a bottom electrode 420, $SiO_x$ layer 430, and a top electrode 440. As shown in the side view in FIG. 3A, the memory may be formed in a crossbar arrangement. A passivation layer 450, such as $SiO_2$, or epoxy layer to prevent the oxidation of Si channel by the oxygen in air may be utilized. Conversely, the entire active area may be encapsulated using a commercial epoxy (e.g. Su-8 from Micro-Chem Company). Using e-beam lithography, the word/bit metal lines could be aggressively scaled to a few tens of nanometer scale. The active Si-switching channel is sub-5 nm, thereby indicating that this aggressive scaling is possible. In some embodiments, individual memory cells may be scaled down to 50 nm or less. In some embodiments, individual memory cells may be scaled down to 20 nm or less. In some embodiments, individual memory cells may be scaled down to 10 nm or less.

Potential Integration Architectures: One Selector (or Diode)-One resistor (1D-1R) (e.g. Using the PN Diode or the Oxide-Based Selector)

(1) Selector candidates: Table 1 (See FIG. 4) provides a nonlimiting summary of two terminal diode and selector materials.

Figures 4, 5A, 5B:
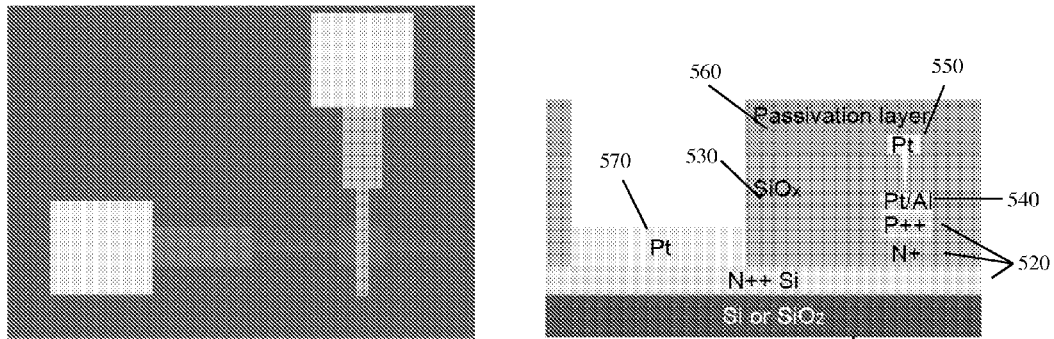
FIG. 4 is a table providing a nonlimiting summary of two terminal diode and selector materials (Table 1)
FIGS. 5A-5B show a top and side view of an illustrative embodiment of a one diode-one resistor (1D-1R) junction structure.

(2) 1D-1R based on the pn diode and the nanoporous silicon oxide memory: A 1D-1R junction structure may be available to "one layer" for the 1D-1R device as shown in FIGS. 5A-5B. The substrate 510 may provide a diode 520 and silicon oxide memory. Extrapolation to a 3D stackable memory may be difficult due to the doped Si layer. The diode 520 may be composed of $P^{++}/N^+/N^{++}$ Si positioned in contact with electrodes 540 and 570. According to the doping level of Si, the rectification ratio and the current level may be adjusted, and it can be matched to the current level of the memory. An electrode 540, $SiO_x$ layer 540, and electrode 550 may be provided for the silicon oxide memory. The $SiO_x$ can be formed by Spin-on Glass (SOG) to planarize the rough surface. A passivation layer 560 may be provided to protect the device from environmental conditions. In some embodiments, deposition methods for $SiO_x$ might need CMP (chemical mechanical planarization). It can be envision that the 1D-1R crossbar device forms from the well-defined Si diode's rectification property, but this poses scalability issues (<50 nm) due to increases of the leakage current by tunneling at the thin Schottky barrier.

(3) 1D-1R based on the pn diode and the nanoporous silicon oxide memory: A 1D-1R junction structure as shown in FIGS. 6A-6B can be extended to a 3D stackable memory. Diode fabrication: The bottom electrode 620 (e.g. Ti/Pt/Ti) of the diode device was deposited by an electron beam evaporator or a sputterer onto a $SiO_2$/Si substrate 610. In order to make ohmic contact, the $TiO_2$ (20-30 nm) was deposited by an atomic layer deposition. After, Pt metal was deposited on the $TiO_2$ layer for making of a Schottky barrier 630. $SiO_x$ layer 640 and electrode 650 may be provided for the silicon oxide memory in contact with Schottky barrier 630. A passivation layer 660 may be provided to protect the device from environmental conditions. Other oxide-based selectors (threshold switch or diode) can be used in this structure. While the above discusses a specific order of integration, it will be understood by one of ordinary skill in the art that other embodiments may rearrange the order of integration. For example, in some embodiments, the order of integration of the device can be changed, such as to position the memory below the diode or to for a 1R-1D structure.

3D stackable 1D-1R device: A stacking 1D-1R junction structure is shown in FIG. 7. Bottom electrode 720 (e.g. Ti/Pt/Ti) is provided on a substrate 710 ($SiO_2$/Si). A first Schottky barrier 740 (e.g. Pt/$TiO_2$) is provided on top of bottom electrode 720. A first nanoporous silicon oxide memory is provided by $SiO_x$ layer 730 and electrode 740. A second Schottky barrier 750 (e.g. $TiO_2$/Pt) is also provided. A second nanoporous silicon oxide memory is provided $SiO_x$ layer 730 and electrode 760 in contact with second Schottky barrier 750. A passivation layer 770 may be provided to protect the device from environmental conditions. The second diode layer should be located on the $SiO_x$ memory junction in the first layer of 1D-1R. Other embodiments may rearrange the order of integration. For example, in some embodiments, the order of integration of the device can be changed, such as to a 1R-1D structure.

Experimental Example

The following example discussed below, as well as other examples, is included to demonstrate particular aspects of the present disclosure. It should be appreciated by those of ordinary skill in the art that the methods described in the examples that follow merely represent illustrative embodiments of the disclosure. Those of ordinary skill in the art should, in light of the present disclosure, appreciate that many changes can be made in the specific embodiments described and still obtain a like or similar result without departing from the spirit and scope of the present disclosure.

As a nonlimiting example, the NP $SiO_x$ structure shown was prepared by anodic galvanostatic etching of $SiO_2$ with 1 vol % HF in ethanol solution to afford a significantly roughened morphology of the deposited $SiO_x$ film (e.g. FIGS. 1B and 11A-11D). Transmission electron microscopy (TEM) micrographs show that nanoscale holes in the $SiO_x$ film are approximately randomly distributed with diameters ranging from 2 to 6 nm (FIGS. 1C and 11A-11D). The average porosity of the NP $SiO_x$ film can be defined by its effective refractive index (n) based on the Bruggemann effective medium approximation, which was estimated by the numerical fitting of a visible reflectance spectrum of the NP $SiO_x$ film. The optically defined average porosity value of the NP $SiO_x$ material was p=25% (FIG. 1D); the etching process created a substantially nanoporous $SiO_x$ material. However, no significant change was made in their composition according to X-ray photoelectron spectroscopy (XPS) of NP $SiO_x$ (x=1.63 to 1.76) relative to non-porous $SiO_x$ (FIGS. 1E-1F and 12). Note that the Pt layer is fully exposed by over-etching when 5 vol % HF is used, which results in no switching behavior (FIG. 12). Additional details on the fabrication process, measurements, and porosity calculation for the NP $SiO_x$ memory are discuss further below. The top contacts (Au or Pt) were subsequently applied and no further etching of the individual devices is required (FIG. 12).

Figures 14A, 14B, 14C:
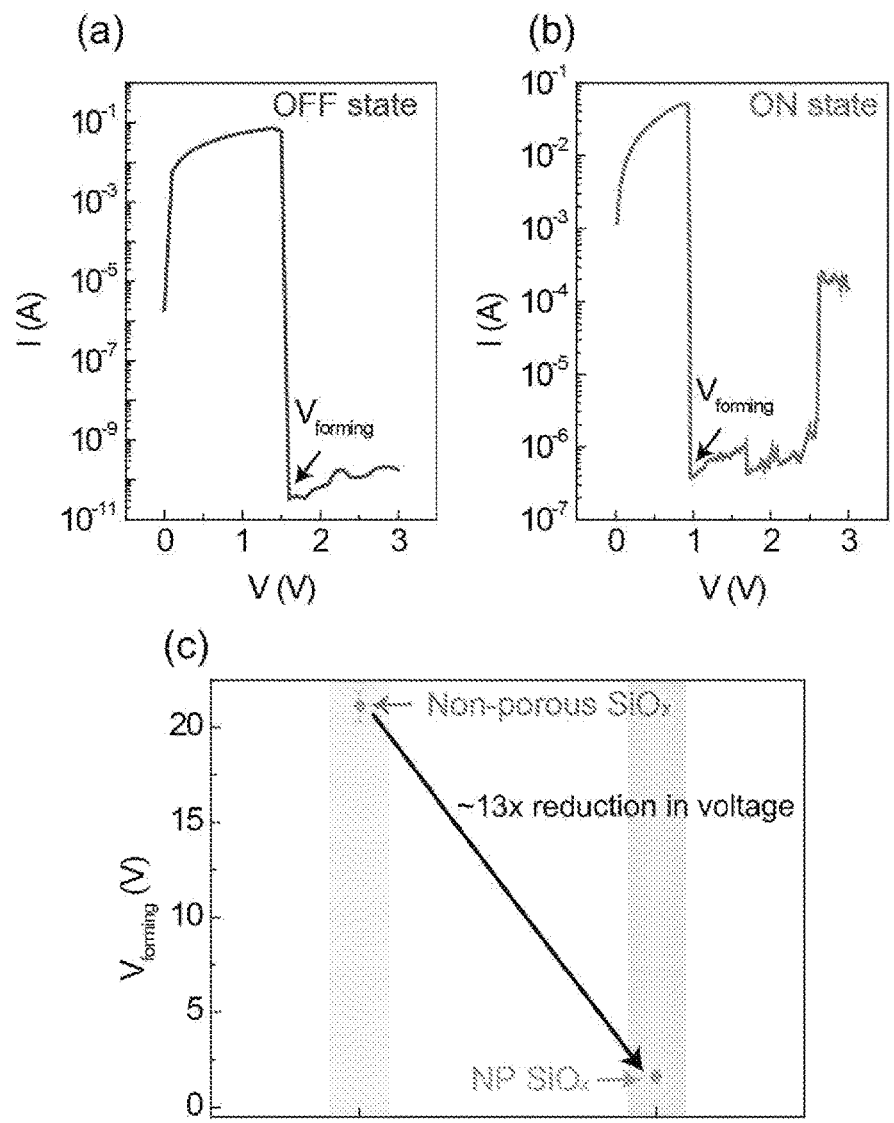
FIGS. 14A-14C show (a,b) a breakdown process from the intial I-V sweep in the different NP $SiO_x$ memory devices with Au top electrode, where the initial switching state in NP $SiO_x$ memory has one of two states ((a) OFF and (b) ON state) after the breakdown process, and (c) the electroforming voltages for non-porous and NP $SiO_x$ memory devices.
Figures 15A, 15B:
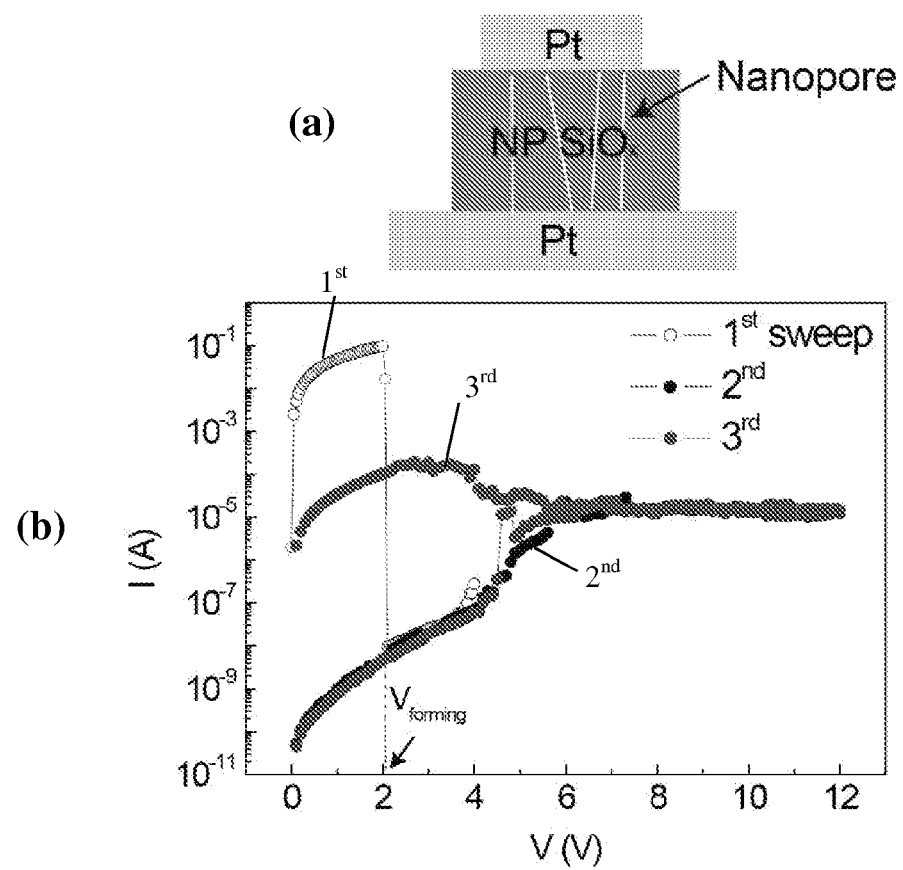
FIGS. 15A-15B show (a) a schematic diagram for a NP $SiO_x$ memory device using top Pt electrode, and (b) electroforming process and switching I-V curve of the NP $SiO_x$ memory device using a top Pt electrode.

FIG. 1G shows a typical switching I-V curve of the NP $SiO_x$ memory after an electroforming process, where no $I_c$ is applied. All NP $SiO_x$ memories showed a unipolar switching behavior similar to that of a non-porous $SiO_x$ memory with $I_{ON}$ and $I_{OFF}$ controlled by a constant polarity of set and reset voltages. This is a greatly simplified electroforming process relative to non-porous $SiO_x$ (FIG. 13A-13C). Electroforming of the NP $SiO_x$ memory can be achieved by a single low-voltage sweep to a breaking voltage ($V_{break}$=1.4 V) where a current suddenly drops, thus we can define the $V_{break}$ as the $V_{forming}$, as shown in the inset of FIG. 1G. In addition, the junction vertical edge of non-porous $SiO_x$ memory is essential for the electroforming process and switching. For non-porous $SiO_x$, an exposed vertical edge is often provided between the two electrodes to allow a filament to form during an electroforming process. However, as shown in FIGS. 13B-13C, the vertical edge was not needed for the NP $SiO_x$, exemplifying the marked ease in fabrication demands. The I-V behavior in FIG. 1G (inset) is typical of metal filament breakage, and at that point, the Si nanofilament is likely formed in the metal gap region. The NP $SiO_x$ memory with an Au top-electrode required $V_{forming}$ of only ~1.6 V on average to form a switching path, compared to the significantly higher $V_{forming}$ for a non-porous $SiO_x$ memory of >20 V (FIGS. 14A-14C). The low forming voltage and a single sweep for the electroforming process are advantageous in high-density integration of nanoscale memory cells with diodes by avoiding potential breakdowns due to a the high forming voltage and by repeated voltage sweeps. The single low voltage sweep also mitigates the problematic Joule-heating-damage to the surrounding $SiO_x$ material, thus reducing the uncertainty in the stochastic formation of the switching filament. The NP $SiO_x$ memory using a Pt top-electrode instead shows similar switching behavior with, as expected, a slightly higher $V_{forming} \cong 2.1$ V (FIG. 15A-15B).

Figure 16:
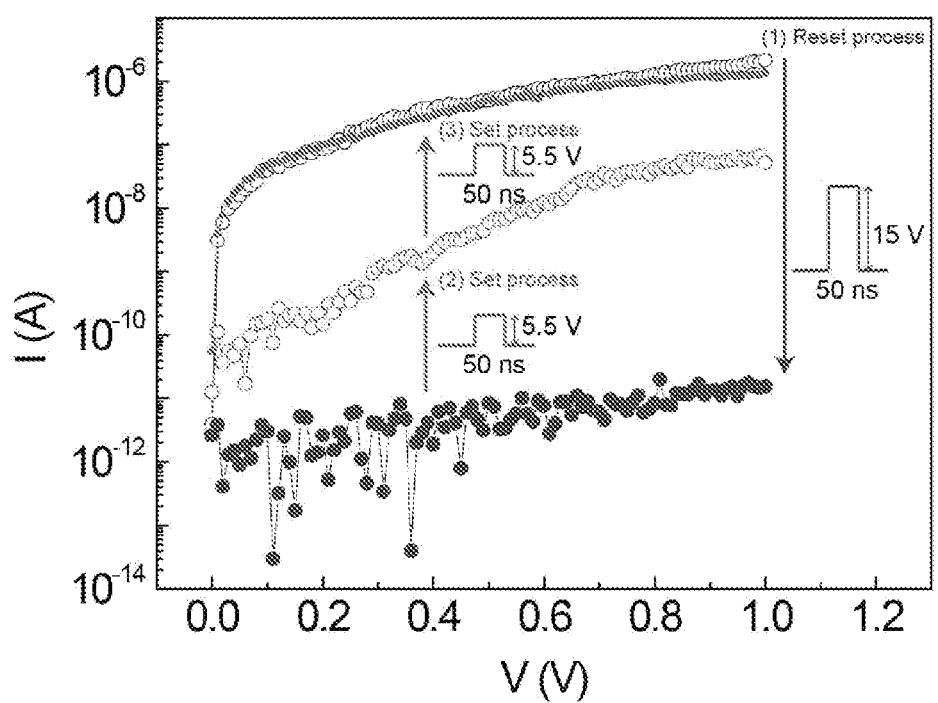
FIG. 16 shows a switching speed test for a NP $SiO_x$ memory device (instruments testing limit is 50 ns)

Similar switching speeds (sub-50 ns, measurement limit) for the set and reset process were observed in the NP $SiO_x$ memory (FIG. 16) as compared to that of the non-porous $SiO_x$ memory.

In order to evaluate the sensitivity and stability of the switching filament in the NP $SiO_x$ memory, the switching current levels and the retentions at 1.0 V after different voltage pulses ($V_{pulse}$) on the same cell of the device were tested. FIG. 8A shows the switching I-V behavior for 9-bits after different $V_{pulse}$ changed from 13 V to 4 V (with $\Delta V$=1 V). The Au top contact had a 100 μm radius while the NP $SiO_x$ was 40 nm thick. FIG. 8B shows current (A) retention results at two different temperatures (20° C. and 100° C.) after the $V_{pulse}$. The ON-OFF ratios of each state are varied from ~2.5 to $10^7$ according to the $V_{pulse}$ and are maintained for $10^4$ s even at 100° C. When the $V_{pulse}$ was decreased, the read-current ($I_{read}$) at 1.0 V increased while the set voltage ($V_{set}$) decreased (FIG. 8A inset), similar to the behavior of the non-porous $SiO_x$ memory. It has been suggested that the conducting filament comprising of silicon nanocrystals (Si NCs) can be significantly disrupted by the higher $V_{pulse}$, which results in lower $I_{read}$. To our knowledge, however, this is the first demonstration of an oxide-based memory device with a 9-bits switching ability with ON-OFF ratio$\cong 10^7$ A, making this device promising as a multi-bit memory system. Moreover, this multi-bit feature, coupled with the 5 nm diameter Si NC filament, makes the RRAM device attractive for aggressive equivalent scaling.

Figures 17A, 17B:
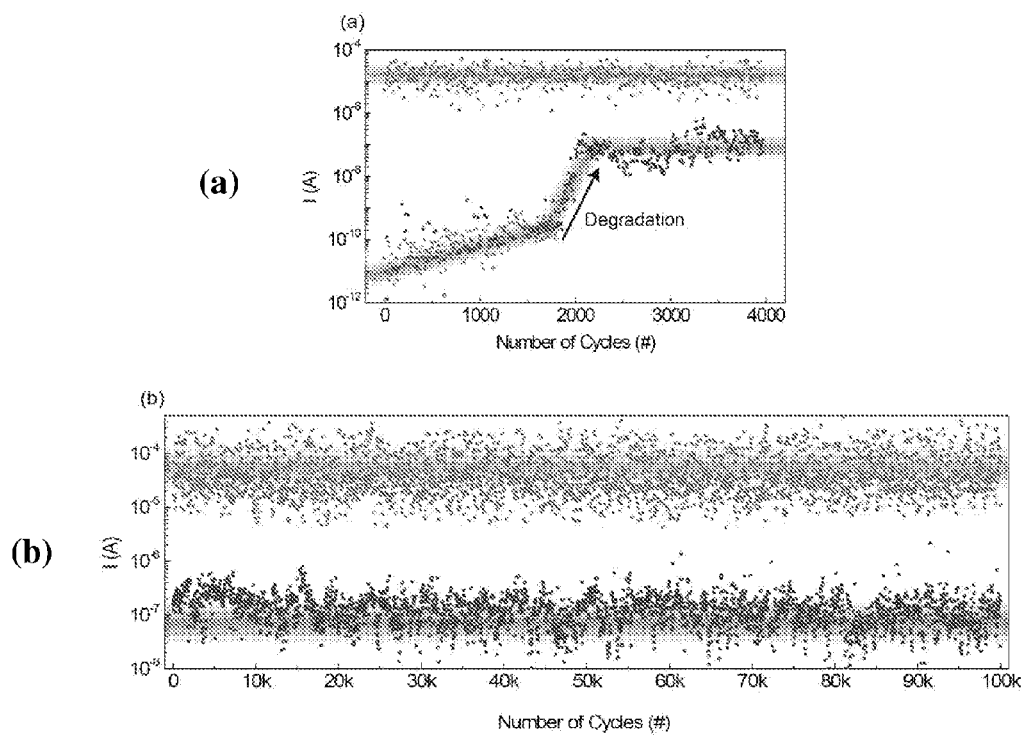
FIGS. 17A-17B show (a) endurance cycling test of the NP $SiO_x$ cell for $4 \times 10^3$ cycles, and (b) endurance cycling test of the NP $SiO_x$ cell for $10^5$ cycles after the degradation event.

The switching endurance stability is a crucial factor for the practical application of nonvolatile memory devices, which is one of the main challenges in unipolar memory. In the case of non-porous $SiO_x$, the ON- and OFF-current values became similar after $10^3$ to $10^4$ cycles demonstrating its limited life cycle due to the extensive aggregation of the Si NCs formed in the switching path by accumulated voltage stresses, which causes the indistinctive switching states (FIG. 8C, top). In contrast, the ON-OFF ratio of the NP $SiO_x$ memory was significantly less degraded during $10^3$ cycles and shows at least $10^6$ ON-OFF ratio (FIG. 8C, bottom). Interestingly at $2 \times 10^3$ cycles for the NP $SiO_x$, the OFF-current increased and maintained $10^{-7}$ A (FIG. 17A). After that, it was demonstrated an excellent endurance property of $10^3$ ON-OFF ratio during $10^5$ cycles, as shown in FIGS. 8C-8D and 17B.

Figures 9A, 9B, 9C:
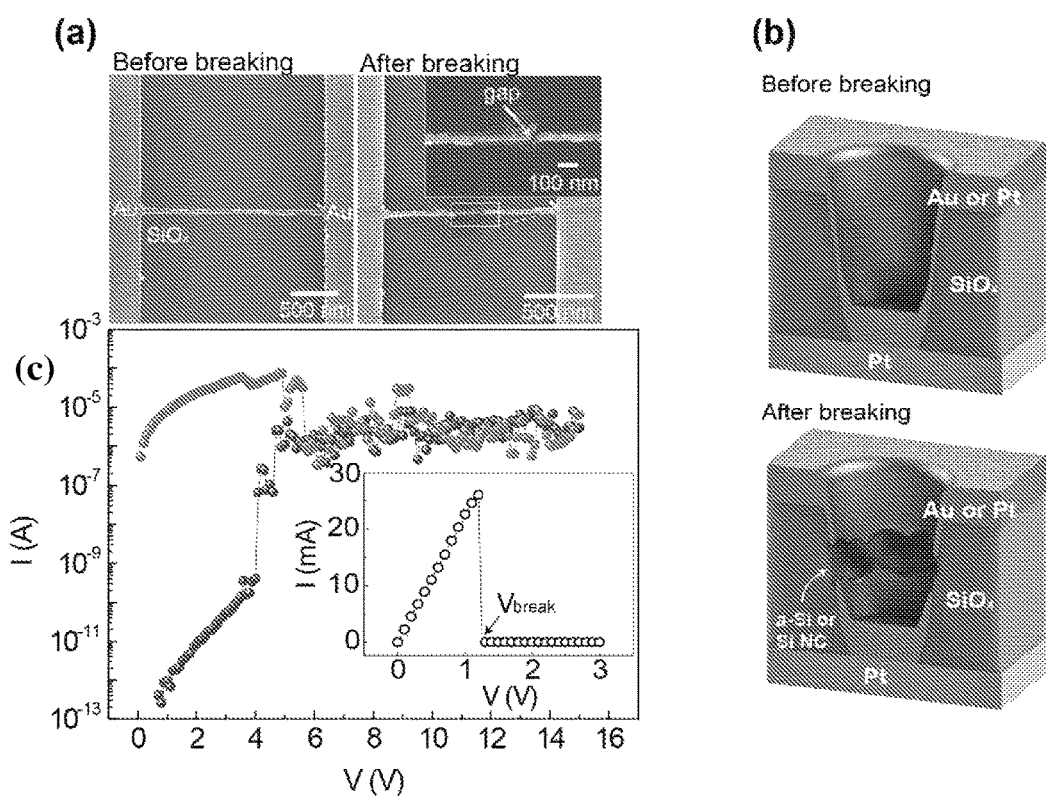
FIGS. 9A-9C are (a) a top SEM images show the planar Au/$SiO_x$ memory device before (left) and after (right) the breakdown of the Au nanowire with the enlarged via in the inset, (b) schematics of the NP $SiO_x$ memory structure before (top) and after (bottom) the breakdown of Au (or Pt) channel though a nanohole, and (c) a plot showing typical I-V switching characteristics of a nanogap device with an Au nanowire width of 60 nm (top figures) with the initial I-V sweep (Inset)
Figures 10A, 10B, 10C, 10D:
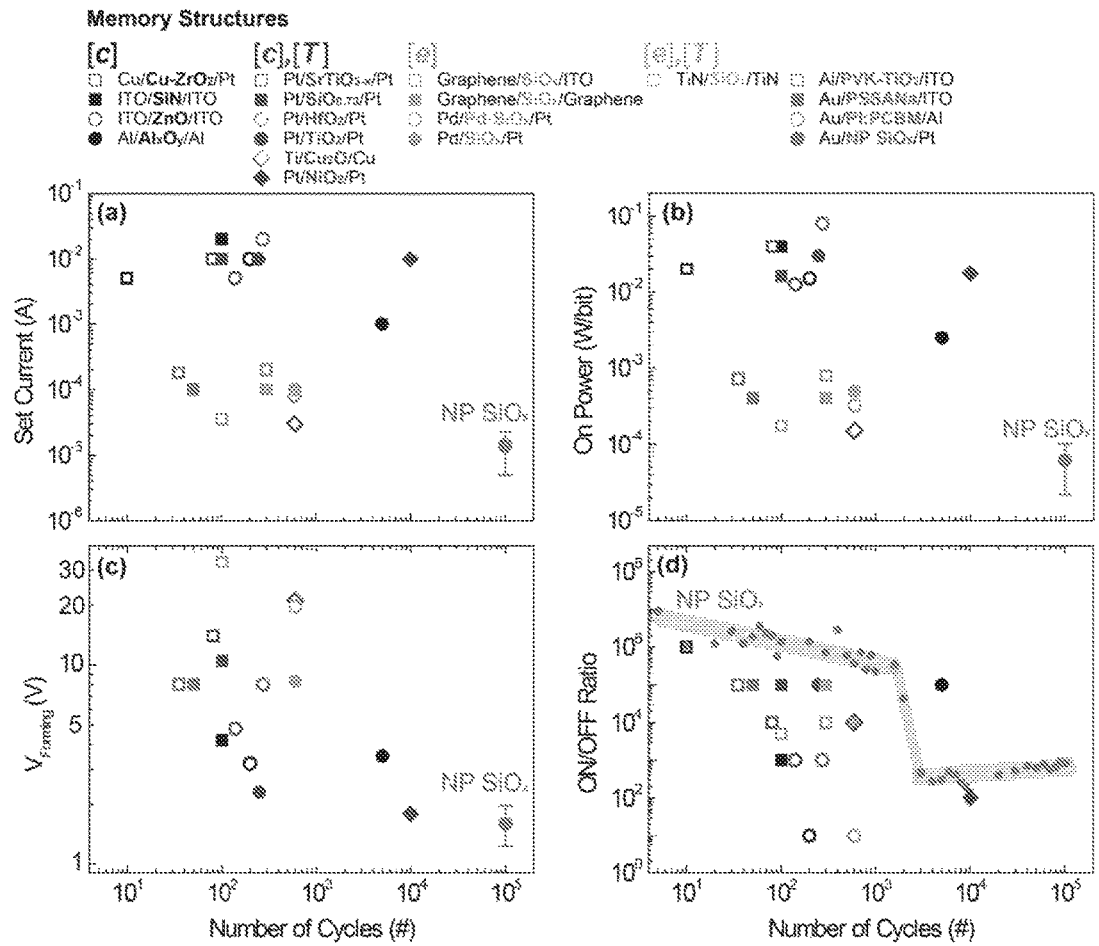
FIGS. 10A-D are plots of a (a) set current, (b) ON power, (c) $V_{forming}$, and (d) ON-OFF ratio corresponding to the number of endurance cycles for the NP $SiO_x$ and other reported unipolar memory devices, with the notations of [c], [e], or [T] indicating whether compliance current ($I_c$), the junction vertical edge, and/or a high temperature process are necessary for achieving desired switching behavior for the respective devices.
Figures 18A, 18B:
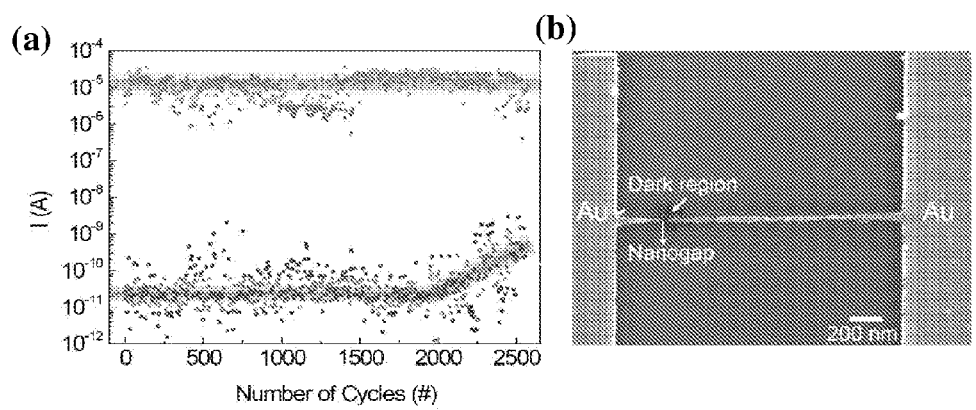
FIGS. 18A-18B show (a) the endurance cycling test of the $SiO_x$ nanogap device for $2.5 \times 10^3$ cycles, and (b) the SEM image after the breakdown process.

To identify the switching mechanism of the NP $SiO_x$ memory, a planar model structure of the $SiO_x$ memory device was fabricated using an Au nanowire with a width of 60 nm. When an initial voltage sweep was applied to the Au nanowire, an electrical breakdown occurred at 1.25 V by the electromigration of Au and the electrical current suddenly dropped (top and inset of FIG. 9A), which would be conceptually similar to the occurrence in the vertical NP $SiO_x$ memory. The SEM image shows a relatively dark region near the gap indicating the intrinsic post-breakdown of underlying $SiO_x$ by the thermal damage induced by electromigration (FIG. 18B). A subsequent electric potential (>1.25 V) at the local confinement (≤20 nm) could easily change the $SiO_x$ to a Si-phase (Si NC or a-Si), as demonstrated previously. The planar model device showed the typical $SiO_x$ unipolar switching behavior after this breakdown process (FIG. 9A), which offers a route to decrease the $V_{forming}$ without a thermal annealing treatment. The post-breakdown process of $SiO_x$ could help to form the switching filament at a low bias, which leads to the extended endurance cycles as well (FIG. 18B). Note that $SiO_x$ memories analogous to this planar model structure have been previously reported, but with various electrode materials including α-carbon, TiN, carbon nanotubes, and graphene, and they all showed a similar breakdown process at an initial I-V sweep. Therefore, it is suggest that the switching mechanism of the NP SiO$_x$ can be understood by the breakdown process of Au on the sidewalls of nano-holes through the SiO$_x$ film as illustrated in FIG. 9B. Interestingly, the initial switching state of the NP SiO$_x$ memory has either an ON or OFF state after the breakdown process, which means that the switching path in the vertical-nanogap is mainly formed by a Si NC or a-Si (FIGS. 14A-14B). This mechanism, based on the electromigration of a metal wire, can also explain why the V$_{forming}$ of NP SiO$_x$ using the more refractory Pt top-electrode has the slightly higher value than that of the NP SiO$_x$ using the Au top-electrode (FIGS. 14A-14C and 15A-15B).

The demonstrated RRAM switching parameters of the NP SiO$_x$ memory, including the set current, the ON power, the V$_{forming}$, and ON-OFF ratio with the endurance cycles, are compared with the reported unipolar memories as well as other types of non-porous SiO$_x$ memories using metal electrodes, as shown in FIGS. 10A-10D. In the comparison, the set-current (1.4±0.9×10$^{-5}$ A), the ON power (6.2±4.0×10$^{-5}$ W/bit), and V$_{forming}$ (1.6±0.4 V) are the lowest values while the ON-OFF ratio was slightly higher at the given number of cycles for this NP SiO$_x$ memory (see FIG. 19, Table 2, where the first two are NP SiO$_x$ unipolar memory and the remaining entries are non-porous unipolar memory). Importantly, many unipolar memories require I$_c$(denoted as "[c]" in FIGS. 10A-10D), junction edge-switching [e], or the high temperature processing [T] for the switching, whereas the NP SiO$_x$ devices do not require any of these, which is an important consideration for large-scale fabrication of nonvolatile memory technologies.

Clearly, the RRAM memory structure using a NP SiO$_x$ can show excellent switching behavior far beyond the current unipolar memory systems and enables simpler fabrication and operating procedures than bipolar RRAMs. The switching mechanism can be explained by the breakdown process of an initial metal connection at a low bias regime that can effectively mitigate the undesired Joule-heating-damage of the switching path at V$_{forming}$. The results suggest that the NP SiO$_x$ memory system could offer a new device paradigm for future memory applications.

Fabrication of the NP SiO$_x$ memory device. The NP SiO$_x$ memory devices were fabricated on a p-type (100) Si substrate (15 mm×15 mm) covered with a thermally grown 300 nm-thick SiO$_2$ layer. A Pt bottom-electrode (100 nm) was deposited on the substrate by sputtering or e-beam evaporation after a typical cleaning process with acetone, isopropyl alcohol, and deionized (DI) water by ultrasonication (bath) for 3 min. Then, SiO$_x$ (30-50 nm thick) was deposited on the Pt bottom electrode by using e-beam evaporation (at room temperature) or plasma-enhanced chemical vapor deposition (PECVD) (for 1 to 2 min at 300° C.). The NP SiO$_x$ devices prepared by e-beam evaporation and PECVD show similar switching behaviors. To electrochemically form a porous structure within the deposited SiO$_x$, we performed an anodic galvanostatic treatment of the samples in a dilute HF/ethanol solution (S1-S3). The dilute HF/ethanol solution with concentrations of 1 and 5 vol % were prepared by diluting HF (48 to 51 vol %, J. T. Baker) in absolute ethanol (Pharmo). A two-electrode system was used in the anodic treatments with the SiO$_x$ on a Si substrate as an anode and Pt foil as a cathode. A constant current density of 6.4 mA/cm$^2$ was applied for 30 s to form the NP structure in the SiO$_x$ thin layer. After this anodic etching, samples were rinsed with DI water and dried under a nitrogen flow. Using a circular photo-mask or a circular shadow metal mask method, a top electrode (Au or Pt) was deposited on the NP SiO$_x$ layer with a radius of ~100 μm. An example of the resulting device is shown in FIG. 1A.

Fabrication of the Au—SiO$_x$—Au nanogap memory device. The Au nanowire junctions (~60 nm wide) were patterned on Si/SiO$_2$ substrates by conventional e-beam lithography (JEOL 6500F SEM) with 950 PMMA resist. The e-beam current was 300 pA at 30 kV acceleration voltage. Patterns were developed in 1:3 methyl isobutyl ketone (MIBK)-isopropyl alcohol (IPA) developer, followed by the sputter deposition of 50 nm thick Au (Denton Desk V Sputter system). After the breaking process of Au nanowire by electromigration, the Au—SiO$_x$—Au nanogap memory device was fabricated. An example of the resulting device is shown in FIG. 9A.

Optical measurement and porosity calculation. The reflectance spectra of as-deposited and NP SiO$_x$ layers on Pt-deposited silicon substrate were measured with a visible spectrometer (USB4000, Ocean Optics) connected to an optical microscope (a numerical aperture of 0.4, Axioskop, Zeiss). A bare Pt film was used for a reflectance reference. The effective refractive index of the NP SiO$_x$ layers was calculated by the numerical fitting of the measured reflectance spectra based on an analytical formula and thicknesses information of the SiO$_x$ layers from cross-sectional SEM images. Through all numerical calculations, the optical dispersion relation was included for both Pt and silica. The porosity value corresponding to the effective refractive index of the etched SiO$_x$ was calculated using the Bruggemann effective medium approximation (S4).

Figures 11A, 11B, 11C, 11D:
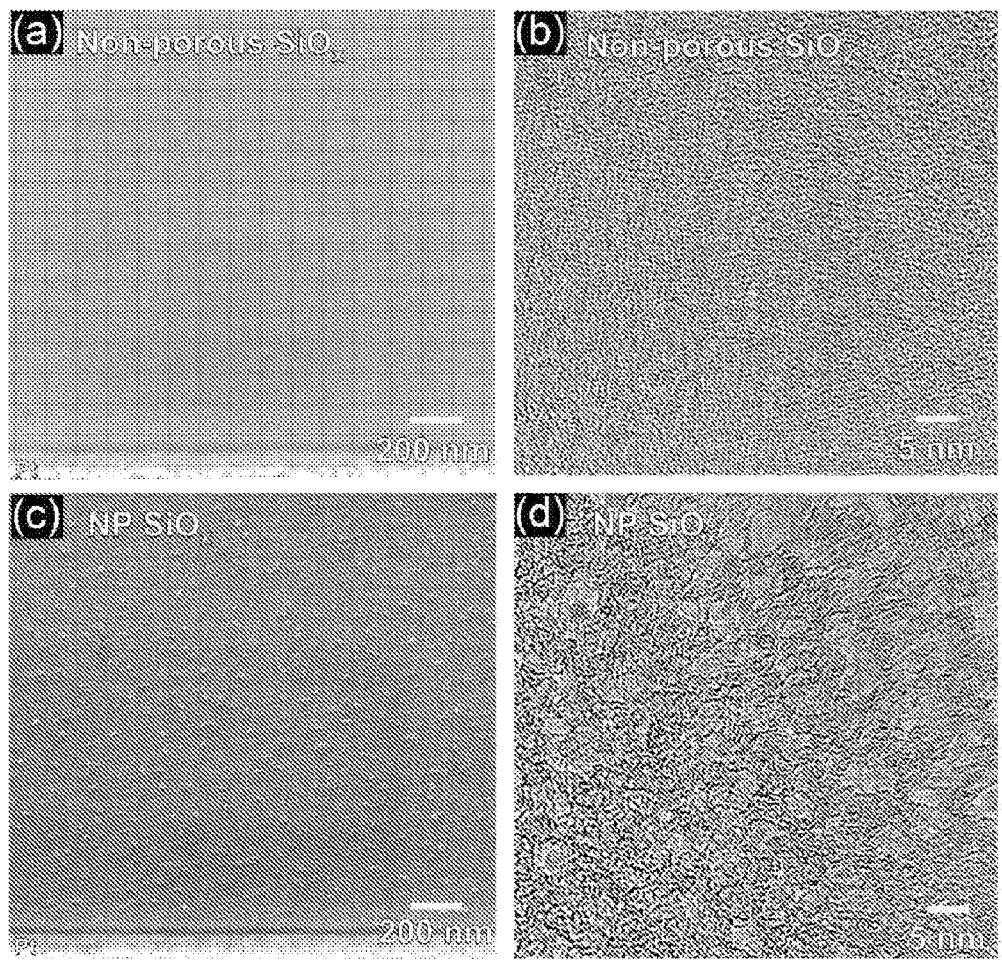
FIGS. 11A-11D show (a) a SEM image of the non-porous $SiO_x$ film at 45° tilt mode, (b) TEM image of the non-porous $SiO_x$ film, (c) SEM image of the nanoporous $SiO_x$ film at 45° tilt mode, and (d) TEM image of the nanoporous $SiO_x$ film that shows the voids in the amorphous $SiO_x$.

Scanning electron microscope (SEM) characterization. RRAM structures having unetched or etched SiO$_x$ layer were cleaved and characterized by a field emission SEM (JEOL 6500F, 10 kV). All SEM images were taken without additional conduction layer deposition after grounding the Pt bottom-electrode. The changes in thickness and surface morphology due to the etching process were observed from the high resolution SEM images (FIGS. 11A and 11C).

Transmission electron microscopy (TEM) characterization. The morphology and porous feature of the SiO$_x$ were assessed by bright field images taken at 200 keV on a field emission TEM (JEOL 2100). In order to prepare a sample for the TEM analysis, a NP SiO$_x$ film was formed on Ni (20 nm)/SiO$_2$/Si substrate. The SiO$_x$ sample was dipped in 1 M HCl solution for 12 h to etch the Ni and was picked up by a TEM grid. The sample was dried overnight after thoroughly removing chemical residues using DI water. See FIGS. 11B and 11D.

X-ray photoelectron spectroscopy (XPS) analysis. The unetched and etched SiO$_x$ films on Pt metal were investigated for their chemical composition by XPS (PHI Quantera XPS, Physical Electronics, USA). All the XPS spectra were calibrated according to the binding energy of the C1s peak at 284.5 eV.

Electrical measurements. The electrical characterizations were performed under vacuum (<10$^{-3}$ Torr) (Desert Cryogenics model CPX, Lakeshore Cryotronics, Inc.) using a B 1500 semiconductor parameter analyzer equipped with a pulse generator. All electrical measurements were obtained with the bias voltage applied to the bottom Pt electrode while the top Au (or Pt) electrode on the NP SiO$_x$ was grounded.

Embodiments described herein are included to demonstrate particular aspects of the present disclosure. It should be appreciated by those of skill in the art that the embodiments described herein merely represent exemplary embodiments of the disclosure. Those of ordinary skill in the art should, in light of the present disclosure, appreciate that many changes can be made in the specific embodiments described and still obtain a like or similar result without departing from the spirit and scope of the present disclosure. From the foregoing description, one of ordinary skill in the art can easily ascertain the essential characteristics of this disclosure, and without departing from the spirit and scope thereof, can make various changes and modifications to adapt the disclosure to various usages and conditions. The embodiments described hereinabove are meant to be illustrative only and should not be taken as limiting of the scope of the disclosure.

What is claimed is:

1. A method for forming a memory device, the method comprising:
   (a) depositing a bottom electrode on a substrate;
   (b) depositing a memory material layer on the bottom electrode, wherein the memory material layer is $SiO_x$, where $0.2 \leq x \leq 2$;
   (c) etching the memory material layer to form a pore that extends through the memory material layer to the bottom electrode, wherein the pore defines an internal volume within the memory material layer;
   (d) depositing a top electrode of electrode material onto the memory layer and into the pore: and then
   (e) creating a switching channel of silicon between the electrode material within the pore and the bottom electrode by electroforming the memory material.

2. The method of claim 1, wherein the pore has a size measured perpendicularly to a thickness of the memory material layer, the size being between 0.1 to 10 nanometers (nm).

3. The method of claim 1, wherein the pore is formed by anodic etching, E- beam lithography, or RIE with nanoparticles.

4. The method of claim 3, wherein the anodic etching is performed in a HF/ethanol solution.

5. The method of claim 4, wherein the HF/ethanol solution has a concentration equal to or between 0.01-10%.

6. The method of claim 1, wherein creating the switching channel further comprises electroforming with a single voltage sweep having a peak of less than 5 V.

7. The method of claim 1, wherein the memory device provides cycling endurance equal to greater than $2 \times 10^3$ cycles.

8. The method of claim 1, wherein the memory device provides multi-bit storage in a single cell.

9. The method of claim 1, wherein the memory device provides a power consumption $6 \times 10^{-5}$ W/bit or less.

10. The method of claim 1, wherein the memory device is part of a one diode-one resistor (1D-1R), one selector-one resistor (1S-1R), or one transistor-one resistor (1T-1R) junction structure.

11. The method of claim 1, wherein the memory device is a memristor.

12. A memory device comprising:
    (a) a bottom electrode;
    (b) a top electrode of electrode material;
    (c) a memory material disposed between the bottom electrode and the top electrode, wherein the memory material is $SiO_x$ where $0.2 \leq x \leq 2$;
    (d) a pore that extends between the top electrode and the bottom electrode through the memory material, wherein
       (i) the pore defines an internal volume within the memory material, and
       (ii) the electrode material of the top electrode extends into the internal volume of the pore; and
    (e) a switching channel of silicon electrically coupled between the electrode material within the internal volume and the bottom electrode, wherein the switching channel configured to switch between a first resistance and a second resistance higher than the first resistance based on application between the top and bottom electrodes of a voltage.

13. The device of claim 12, wherein the pore has a size measured perpendicularly to a thickness of the memory material, the size being between 0.1 to 10 nanometers (nm).

14. The device of claim 12, wherein the memory device provides cycling endurance equal to or greater than $2 \times 10^3$ cycles.

15. The device of claim 12, wherein the memory device provides multi-bit storage in a single cell.

16. The device of claim 12, wherein the memory device provides a power consumption $6 \times 10^{-5}$ W/bit or less.

17. The device of claim 12, wherein the memory device is part of a one diode-one resistor (1D-1R), one selector-one resistor (1S-1R), or one transistor-one resistor (1T-1R) junction structure.

18. The device of claim 12, wherein an electroforming voltage for the memory device is 10 V or less.

19. The device of claim 12, wherein a current lifetime of the memory device is equal to or greater than $10^4$ seconds at 100° C.

20. The device of claim 12, wherein the memory device is a memristor.

21. The memory device of claim 12, wherein the switching channel is configured to have the first resistance based on application of between 3 and 6 Volts, inclusive, between the top electrode and the bottom electrode, and the switching element is configured to have the second resistance based on application of 7 Volts or greater between the top electrode and the bottom electrode.

22. The memory device of claim 12, wherein
    (a) the switching channel is configured to have the first resistance based on application of a first voltage between the top electrode and the bottom electrode, wherein,
       (i) upon application of the first voltage, the switching channel is operable to comprise a conducting filament comprising silicon nanocrystals or a-Si;
    (b) the switching element is configured to have the second resistance based on application of a second voltage between the top electrode and the bottom electrode, wherein
       (i) upon application of the second voltage, the switching channel is operable to comprise a broken down conducting filament, and
       (ii) the first voltage is less than the second voltage.

23. The method of claim 1 further comprising creating a first resistance across the switching channel by applying between 3 and 6 Volts, inclusive, between the top electrode and the bottom electrode, and creating a second resistance of the switching element, the second resistance higher than the first resistance, by applying 7 Volts or greater between the top electrode and the bottom electrode.

24. The method of claim 1 further comprising
    (a) creating a first resistance across the switching channel by applying a first voltage
       (i) between the top electrode and the bottom electrode, wherein applying the first voltage results in a conducting filament comprising silicon nanocrystals or a-Si positioned between the top electrode and the bottom electrode; and (b) creating a second resistance of the switching element by applying a second voltage between the top electrode and the bottom electrode, wherein
   (i) applying the second voltage results in a breakdown in the conducting filament, and
   (b) the first voltage is less than the second voltage.

* * * * *